(12) United States Patent
Kawasaki et al.

(10) Patent No.: US 6,677,221 B2
(45) Date of Patent: Jan. 13, 2004

(54) SEMICONDUCTOR DEVICE AND THE FABRICATING METHOD THEREFOR

(75) Inventors: Ritsuko Kawasaki, Kanagawa (JP); Hiroki Adachi, Kanagawa (JP); Kazuhide Tomiyasu, Nara (JP); Hiroyuki Ogawa, Nara (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 0 days.

(21) Appl. No.: 10/166,151

(22) Filed: Jun. 10, 2002

(65) Prior Publication Data

US 2002/0149057 A1 Oct. 17, 2002

Related U.S. Application Data

(62) Division of application No. 09/550,829, filed on Apr. 18, 2000, now Pat. No. 6,424,012.

(30) Foreign Application Priority Data

Apr. 20, 1999 (JP) ............................. 11-111605

(51) Int. Cl.[7] ............................................. H01L 21/20
(52) U.S. Cl. ....................... 438/486; 438/166; 438/487
(58) Field of Search ................... 438/486, 487, 438/488, 489, 485, 484, 166, 150, 151, 149, 148, 177, 491, 164, 471, 473

(56) References Cited

U.S. PATENT DOCUMENTS

| 5,700,333 A | * | 12/1997 | Yamazaki et al. | ........... 136/258 |
| 5,780,903 A | | 7/1998 | Tsai et al. | ..................... 257/344 |
| 5,843,225 A | * | 12/1998 | Takayama et al. | ............. 117/8 |
| 5,897,347 A | * | 4/1999 | Yamazaki et al. | ........... 438/166 |
| 6,046,479 A | * | 4/2000 | Young et al. | ................ 257/350 |
| 6,066,518 A | * | 5/2000 | Yamazaki | ................... 438/166 |
| 6,140,165 A | * | 10/2000 | Zhang et al. | ................ 438/166 |
| 6,156,628 A | * | 12/2000 | Ohnuma et al. | ............ 438/486 |
| 6,166,397 A | * | 12/2000 | Yamazaki et al. | .......... 257/596 |
| 6,207,971 B1 | * | 3/2001 | Jinno et al. | ..................... 257/72 |
| 6,294,441 B1 | * | 9/2001 | Yamazaki | .................... 438/486 |
| 6,424,012 B1 | * | 7/2002 | Kawasaki et al. | .......... 257/350 |

FOREIGN PATENT DOCUMENTS

| JP | 6-148616 | 5/1994 |
| JP | 8-179298 | 7/1996 |
| JP | 8-179354 | 7/1996 |
| JP | 10-261801 | 9/1998 |
| JP | 10-261802 | 9/1998 |

OTHER PUBLICATIONS

Complete English translation of Japanese Patent Application No. JP 6–148616, published May 27, 1994.
Complete English translation of Japanese Patent Application No. JP 8–179298, published Jul. 12, 1996.
Complete English translation of Japanese Patent Application No. JP 8–179354, published Jul. 12, 1996.
English abstract of Japanese Patent Application No. JP 10–261801, published Sep. 29, 1998.
English Abstract of Japanes Patent Application No. JP 10–261802, published Sep. 19, 1998.

* cited by examiner

Primary Examiner—Carl Whitehead, Jr.
Assistant Examiner—Laura M Schillinger
(74) Attorney, Agent, or Firm—Cook, Alex, McFarron, Manzo, Cummings & Mehler, Ltd.

(57) ABSTRACT

In a semiconductor device employing a glass substrate, the object of the present invention is to provide a high performance semiconductor device with a large screen at low cost, which prevents the semiconductor device from being contaminated by impurities from the glass substrate. In a semiconductor device comprising a blocking film provided in contact with a glass substrate and TFTs provided on the blocking film, the blocking film is characterized by being made of a tantalum oxide film.

7 Claims, 13 Drawing Sheets

N-CHANNEL TFT          P-CHANNEL TFT

SEMICONDUCTOR DEVICE AND THE FABRICATING METHOD THEREFOR

This application is a divisional of U.S. application Ser. No. 09/550,829, filed on Apr. 18, 2000 now U.S. Pat. No. 6,424,012.

TECHNICAL FIELD

The present invention relates to a semiconductor device with thin film transistors (TFT) or the like, which are formed on a glass substrate which employ crystalline semiconductor films, and to the method for fabricating the semiconductor device. The semiconductor device of the present invention includes liquid crystal display devices, EL display devices, EC display devices, image sensors, and the like, which have elements such as thin film transistors (TFT) and MOS transistors as well as semiconductor circuits (mircroprocessors, signal processing circuits, or high frequency circuits) comprising these insulated gate transistors. In addition, the semiconductor device of the present invention also includes electronic apparatuses such as video cameras, digital cameras, projectors, goggle displays, car navigation devices, personal computers, and portable information terminals in which these display devices are mounted.

BACKGROUND OF THE INVENTION

Currently, thin film transistors (TFT) have been frequently used as semiconductor elements that employ semiconductor films. TFTs are used for a variety of integrated circuits, in particular, as switching elements of pixel portions of an active matrix liquid-crystal display device. Moreover, the mobility of the TFT has been improved recently to allow the TFT to be used as an element of the driver circuit for driving pixel portions. For a semiconductor layer for use in driver circuits, it is necessary to employ crystalline semiconductor films that are higher in mobility than amorphous semiconductor films. This crystalline semiconductor film is also called, for example, polycrystalline semiconductor film, polysilicon film, microcrystal semiconductor film and so forth.

What is crucial in improving the property of the TFT is to decrease impurities contained in the semiconductor layers thereof.

Furthermore, as the substrate for use in an active matrix type liquid crystal display device, there have been conventionally used transparent insulating substrates such as quartz substrates and glass substrates. The quartz substrate has a high glass distortion temperature and thus can be increased in crystallization temperature up to the order of 1000° C. so as to decrease the time required for crystallization. However, the quartz substrate is very expensive compared with the glass substrate. Thus, from the point of view of mass production, it is difficult to employ it for large area use. Accordingly, as the substrate for use in a liquid crystal display device, a glass substrate such as Corning 7059 glass with a glass distortion temperature of 593° C. has been widely employed.

The glass substrate for use in the liquid crystal display device has a lower content of impurities such as sodium (Na) than typical soda lime glass. However, it causes a problem to arise wherein a slight amount of impurities such as sodium (Na) diffuses at the time of heating (annealing) the substrate in a process such as in a crystallization process of amorphous semiconductor films to contaminate the semiconductor layers, which become active layers of the TFT, to deteriorate the TFT properties.

In general, in order to prevent the active layers from being contaminated due to sodium coming from the glass substrate, there is provided a silicon nitride film or silicon oxide film as a blocking film between the glass substrate and the active layers. In particular, the silicon nitride film is frequently used because of its high blocking performance to prevent the diffusion of sodium. However, the silicon nitride film provided on the glass substrate is given a significant stress. This leads to a problem in that an annealing process causes the silicon nitride film or films in contact therewith to crack, or the glass substrate to become deformed, damaged and so on. Accordingly, attempts have been made to use a multilayer film of a silicon nitride film and silicon oxide film, or silicon nitride oxide film.

SUMMARY OF THE INVENTION

However, the aforementioned multilayer film or the silicon nitride oxide film used as the blocking film had lower blocking performance than that of a simple silicon nitride film and thus could not ensure the prevention of contaminating impurities from coming out of the substrate. This is caused by the fact that, for the multilayer film, the thickness of the silicon nitride film cannot be made thicker to prevent cracks or the like; for the silicon nitride oxide film, the percentage of nitrogen content cannot be increased to prevent cracks or the like. On the other hand, the glass substrate contains a large amount of sodium, and thus a blocking film has been required which has a high blocking performance.

Furthermore, in the case of a bottom gate TFT, the blocking film is provided as an underlying film that is in contact with the bottom surface of the gate wiring (in this specification, it is to be understood that the gate wiring includes the gate electrode as well). In the case of employing silicon nitride film as the blocking film, this caused peeling to occur in the film of the gate wiring provided on the silicon nitride film, presenting a problem of bad adhesion of the silicon nitride film to the gate wiring.

In view of the aforementioned problems, in a semiconductor device with crystalline semiconductor layers crystallized in an annealing process, the object of the present invention is to form a semiconductor device such as an active matrix type liquid crystal display device at low cost with a large display area and high performance, which is provided with a blocking film that ensures the prevention of diffusion impurities such as sodium to improve TFT properties and which prevents cracks or the like in the coating from decreasing the yield. Moreover, in the bottom gate TFT, another object is to form a blocking film with an excellent adhesion to the gate wiring.

In order to solve the aforementioned problems, the present invention is characterized in that a tantalum oxide (TaOx) film is provided on a glass substrate as a blocking film. In the present invention, the tantalum oxide film refers to a coating predominantly composed of tantalum and oxygen. The tantalum oxide film can be used in thickness within the range of 100 through 500 nm. As for the method for forming the film, the thermal CVD method, the plasma CVD method, a deposition method, a sputtering method, the low pressure thermal CVD method, the thermal oxidation method, the anodizing method or the like can be employed. The tantalum oxide film can effectively block impurities such as sodium. In particular, the sputtering method or the plasma CVD method allows for controlling the stress in the tantalum oxide film to be formed by the deposition conditions, thereby providing an effective means for improving the blocking performance as well as reducing the stress caused by the glass substrate. Among them, in particular, it is most effective to employ the sputtering method which employs a target composed of tantalum and is carried out an atmosphere containing an oxygen gas mixture.

Still furthermore, the tantalum oxide film has excellent adhesion to a conductive film made of a material predominantly composed of one or more elements selected from the group consisting of tantalum (Ta), tungsten (W), molybdenum (Mo), titanium (Ti), chromium (Cr), and silicon (Si) which is typically used as the gate wiring, or to a conductive film made of a material with a melting point equal to those of these elements or higher. Thus, in the bottom gate TFT, this allows for preventing a decrease in the yield due to mal-adhesion of the blocking film to the gate wiring.

As the configuration of the present invention, the contamination derived from the glass substrate to the active layer due to impurities can be prevented by means of the tantalum oxide film. Thus, the concentration of sodium in the gate insulating film, which is provided by the secondary ion mass spectrometry (hereinafter referred to as SIMS), can be made equal to $1 \times 10^{16}$ atoms/cm$^3$ or less which is currently equal to or less than the lower limit of detection in consideration of noise. This allows for making the concentration of sodium in the active layer to contact with the gate insulating film equal to $1 \times 10^{16}$ atoms/cm$^3$ or less, thereby providing improved reliability of TFTs. Moreover, use of the tantalum oxide film as the blocking film can contribute to reducing variations in TFT properties, thereby providing improved reliability of TFTs.

Furthermore, in the configuration of the present invention, it is also effective to provide the substrate, not on only one side thereof but on both sides thereof, with tantalum oxide films. The tantalum oxide films provided on both sides of the substrate can completely block impurities such as sodium diffusing from the substrate at the time of fabricating the semiconductor device. In addition, the glass substrate used in a liquid crystal display device is slightly etched in an etching process that employs a specific acid solution such as a fluoric acid to allow impurities such as sodium (Na) in the substrate to be mixed into the acid solution, leading to a problem in that semiconductor layers that are to serve as the active layers of TFTs are contaminated to cause the TFT properties to deteriorate. Because the tantalum oxide film provides excellent resistance to most acid solutions such as fluoric acid, it is possible to prevent sodium contamination in the etching process by providing the tantalum oxide films on both sides of the substrate. In addition, because of a small coefficient of thermal expansion and outstanding resistance to heat of the tantalum oxide film, the heat resistance of the substrate can be improved by providing the tantalum oxide film on the reverse side of the substrate. Still furthermore, it is also effective to cover (coat) the entire surface of the substrate, including the side surfaces of the substrate, with the tantalum oxide film. The low pressure thermal CVD method can be used to facilitate forming a coating on the side surfaces of the substrate.

A first configuration of the present invention to be disclosed in this specification is characterized by comprising:
  a blocking film in contact with a glass substrate,
  a gate wiring in contact with said blocking film,
  a gate insulating film in contact with said gate wiring, and
  a crystalline semiconductor layer, in contact with said gate insulating film, comprised of a high concentration impurity region, a channel formed region, and a low concentration impurity region between said high concentration impurity region and said channel formed region, wherein said blocking film is made of tantalum oxide.

Furthermore, the structure is characterized in that said gate insulating film has a concentration of sodium of $1 \times 10^{16}$ atoms/cm$^3$ or less.

A second configuration of the present invention to be disclosed in this specification is characterized by comprising the steps of:
  forming a tantalum oxide film on a glass substrate,
  forming a gate wiring on said tantalum oxide film,
  forming a multilayer of a gate insulating film and a semiconductor film on the glass substrate with said gate wiring formed thereon,
  crystallizing said semiconductor film into a crystalline semiconductor film,
  patterning said crystalline semiconductor film to form a crystalline semiconductor layer,
  adding selectively an impurity element selected from the group consisting of group XIII and XV into said crystalline semiconductor layer to form a high concentration impurity region, and
  adding selectively an impurity element selected from the group consisting of group XIII and XV into said crystalline semiconductor layer to form a low concentration impurity region.

Furthermore, a third configuration of the present invention to be disclosed in this specification is characterized by comprising the steps of:
  forming a tantalum oxide film on a glass substrate,
  forming a gate wiring on said tantalum oxide film,
  forming a multilayer of a gate insulating film and a semiconductor film on the glass substrate with said gate wiring formed thereon,
  adding an element into said semiconductor film to accelerate crystallization of the semiconductor film,
  crystallizing said semiconductor film into a crystalline semiconductor film.
  removing the element, in said crystalline semiconductor film, accelerating said crystallization,
  patterning said crystalline semiconductor film to form a crystalline semiconductor layer,
  adding selectively an impurity element selected from the group consisting of group XIII and XV into said crystalline semiconductor layer to form a high concentration impurity region, and
  adding selectively an impurity element selected from the group consisting of group XIII and XV into said crystalline semiconductor layer to form a low concentration impurity region.

Still furthermore, the configuration is characterized in that at least one element selected from the group consisting of Ni, Co, Fe, Pd, Pt, Cu, Au, Ge, Sn, and Pb is used as an element for accelerating said crystallization.

PREFERRED EMBODIMENTS OF THE INVENTION

An embodiment mode is explained with reference to FIG. 1 through FIG. 3. Such an example as the fabrication of an inverted stagger TFT is explained here.

First, a substrate 101 is prepared. As the substrate 101, a glass substrate is used which is predominantly composed of silicon oxide and contains, as an impurity, a trace amount of alkali metal such as sodium. Then, a blocking film 150 that is made of tantalum oxide film to prevent impurities from diffusing out of the substrate to improve the electrical properties of TFTs is provided on the substrate 101. This tantalum oxide film is formed within a thickness range from 100 through 500 nm or preferably from 100 through 300 nm by means of the thermal CVD method, the plasma CVD method, a deposition method, a sputtering method, the low pressure thermal CVD method, the thermal oxidation method, the anodizing method or the like. In particular, the sputtering method or the plasma CVD method is preferably used. More particularly among them, the sputtering method is effectively employed which uses a target made up of tantalum and is carried out in an atmosphere containing an oxygen gas mixture. (FIG. 1A)

Figure 1A:
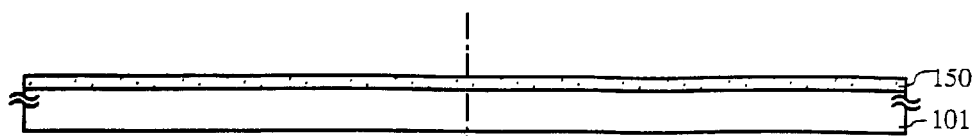
FIGS. 1A–1E are views showing TFT fabrication processes of Example 1.

FIG. 1A shows an example in which a tantalum oxide film is formed only on one surface of the substrate, however, the tantalum oxide film is effectively provided not only on one surface of the substrate but on both surfaces thereof. By providing the tantalum oxide film on both surfaces of the substrate, impurities such as sodium diffusing from the substrate at the time of fabricating the semiconductor device can be completely blocked. Moreover, the tantalum oxide film provides excellent resistance to most acid solutions such as fluoric acid, and thus it is possible to prevent sodium contamination in etching processes by providing the tantalum oxide film on both surfaces of the substrate. Moreover, the tantalum oxide film has a small coefficient of thermal expansion and excellent heat resistance, and thus it is possible to improve the heat resistance of the substrate by providing the tantalum oxide film on the reverse surface of the substrate. Still moreover, the tantalum oxide film can effectively cover the entire surface of the substrate.

Furthermore, even in cases where a transparent insulating substrate such as a quartz substrate, a ceramic substrate, a stainless substrate, a metallic (such as tantalum, tungsten, or molybdenum) substrate, a semiconductor substrate, a plastic substrate (a polyethylene terephthalate substrate) or the like are used, the configuration of the present invention is preferably applied to this case in order to prevent the diffusion of impurities out of the substrate used.

Figure 1B:

Subsequently, a gate wiring (including a gate electrode) 102 is formed which has a single layer configuration or a multilayer configuration (FIG. 1B). As means of forming the gate wiring 102, the thermal CVD method, the plasma CVD method, the low pressure thermal CVD method, a deposition method, a sputtering method, or the like is used to form a conductive film within a thickness range from 10 through 1000 nm or preferably from 30 through 300 nm, and thereafter the film is formed by means of a known patterning technique. In addition, as the material of the gate wiring 102, such materials can be used as a material predominantly composed of a conductive material or a semiconductor material, for example, a high melting point metallic material such as Ta (tantalum), Mo (molybdenum), Ti (titanium), W (tungsten), Cr (chromium) or the like; silicide, which is a compound of these metallic materials and silicon; a material such as polysilicon having N-type or P-type conductivity; and a low resistance metallic material such as Cu (copper), Al (aluminum) or the like. These materials can be used, not limited to a particular one, so long as the film has at least one material layer predominantly composed of these materials.

Furthermore, as the gate wiring, a material predominantly composed of tantalum is used preferably at least as a lower layer of the gate wiring, for example, a single layer of tantalum. Moreover, it is preferable to use, as the gate wiring, a multilayer configuration of a tantalum nitride layer (lower layer), a tantalum layer (middle layer), and a tantalum nitride layer (upper layer). In the case where a material predominantly composed of tantalum is used as the gate wiring, deposition can be carried out without exposing the underlying tantalum oxide film and the conductive film that is to be the gate wiring to the atmosphere increasing the adhesion of the underlying film to the conductive film that is to be the gate wiring. Moreover, it is preferable to perform the deposition successively without exposure to the atmosphere. It is preferable to use the sputtering method at the time of depositing the tantalum oxide film and the conductive film successively. In addition, an insulating film such as an anodized film or an oxide film may be formed in contact with the gate wiring in order to protect the gate wiring and prevent the diffusion of impurities from the gate wiring.

Figure 1C:
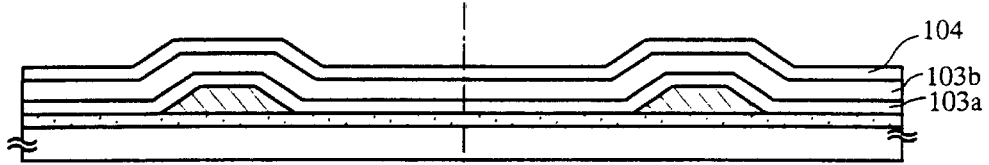

Subsequently, a gate insulating film is formed in contact with the gate wiring. As the gate insulating film, a silicon oxide film, a silicon nitride film, a silicon nitride oxide film (SiOxNy), an organic resin film (BCB) (benzocyclobutane), or a multilayer film of these films can be used within a thickness range from 100 nm through 400 nm. As means for forming the gate insulating film, the thermal CVD method, the plasma CVD method, the low pressure thermal CVD method, a deposition method, a sputtering method, a coating method or the like can be used. As shown in FIG. 1C, gate insulating films 103a and 103b of a multilayer configuration were used here. The lower layer gate insulating film 103a made up of a silicon nitride film or the like was formed within a thickness range from 10 nm through 60 nm to effectively prevent the diffusion of impurities from the gate wiring to the active layer. Furthermore, among the impurities affecting the active layer, most impurities diffusing from the substrate are blocked by means of the blocking film made up of a tantalum oxide film so as to be able to make the concentration of sodium in the gate insulating film equal to $1 \times 10^{16}$ atoms/cm$^3$ or less which is equal to or less than the lower limit of detection of SIMS in consideration of noise, and therefore the silicon nitride film need not be necessarily provided as the gate insulating film.

Subsequently, an amorphous semiconductor film 104 is deposited (FIG. 1C). As the amorphous semiconductor film 104, an amorphous semiconductor film containing silicon, for example, an amorphous silicon film, an amorphous semiconductor film having micro crystals, a micro crystal silicon film, an amorphous germanium film, an amorphous silicon germanium film represented by $Si_xGe_{1-x}$ (0<x<1), or a multilayer film of these films can be used within a thickness range from 10 nm through 80 nm, more preferably, from 15 through 60 nm. As means for forming the amorphous semiconductor film 104, the thermal CVD method, the plasma CVD method, the low pressure thermal CVD method, a deposition method, a sputtering method or the like can be employed. In particular, the sputtering method is preferably employed since the TFTs made up of the amorphous semiconductor films formed by the sputtering method are known to provide excellent electrical properties.

Furthermore, deposition of the aforementioned gate insulating films 103a and 103b and the amorphous semiconductor film 104 without being exposed to the atmosphere will not allow impurities to be mixed into the interface between the gate insulating film and the amorphous semiconductor film, thereby allowing for providing an excellent interface property. It is also preferable to use the sputtering method at the time of depositing the gate insulating film and the amorphous semiconductor film successively. As described above, since the underlying tantalum oxide film and the gate wiring are preferably formed by the sputtering method, it is preferable to form all of the tantalum oxide film, the gate wiring, the gate insulating film, and the amorphous semiconductor film as sputtering film. Moreover, films to be provided on the semiconductor film may be formed by the sputtering method.

Figure 1D:
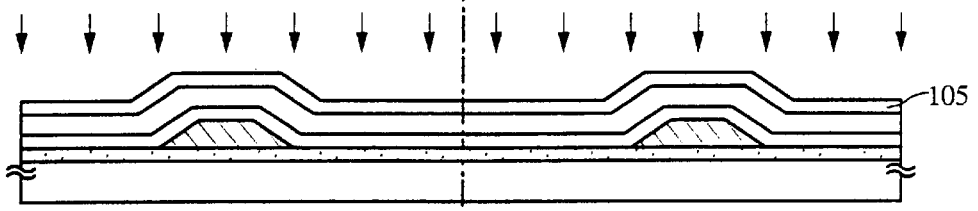

Subsequently, the amorphous semiconductor film 104 is subjected to a crystallization treatment to form a crystalline semiconductor film 105 (FIG. 1D). As the crystallization treatment, any known means, for example, thermal crystallization treatment, a crystallization treatment by means of irradiation of infrared light or ultraviolet light (hereinafter referred to as the laser crystallization), a thermal crystallization treatment with elements for accelerating crystallization, the laser crystallization treatment with elements for accelerating crystallization or the like, or a treatment in combination of these crystallization treatments can be used. Furthermore, FIG. 1D shows the crystallization treatment by means of irradiation with laser light.

Figure 1E:
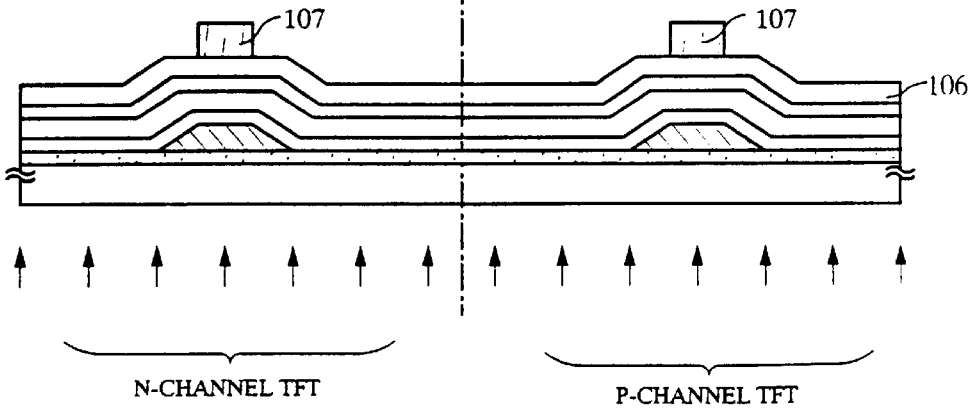

An insulating film 106 is formed on the crystalline semiconductor film 105 formed as such (FIG. 1E). The insulating film 106 is to be patterned in a subsequent process to protect the channel formation region in the process for doping impurities. As the insulating film 106, a silicon oxide film, a silicon nitride film, a silicon nitride oxide film (SiOxNy), an organic resin film (BCB film), or a multilayer film of these films can be used within a thickness range from 100 nm through 400 nm. Then, a mask for forming a channel protection film is formed on the insulating film 106 by means of a known patterning technique, for example, typical exposure, reverse surface exposure or the like (FIG. 1E). Furthermore, FIG. 1E shows a photo-resist mask 107 formed by means of the reverse surface exposure that employs no photo mask.

Figure 2A:
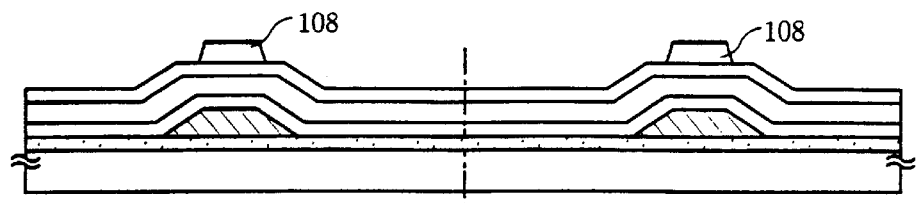
FIGS. 2A–2D are views showing TFT fabrication processes of Example 1.

Subsequently, the photo-resist mask 107 is used to selectively remove the insulating film 106 by means of wet etching or dry etching to form an insulating film 108 (hereinafter referred to as the channel protection film), and thereafter the photo-resist mask 107 is removed (FIG. 2A). Here, the size (length) of the channel protection film in the direction of the source region to the drain region was made smaller than that of the gate wiring (gate electrode) so that part of the gate wiring did not overlap the channel protection film 108 when viewed from the top. Since the surface of the crystalline semiconductor film is exposed through this process, a process for forming a thin oxide film by means of oxidation treatment with ozone water, thermal treatment in an oxidized atmosphere, irradiation with UV light or the like may be added after the removal of the photo-resist mask 107 in order to prevent the contamination of the surface.

Figure 2B:
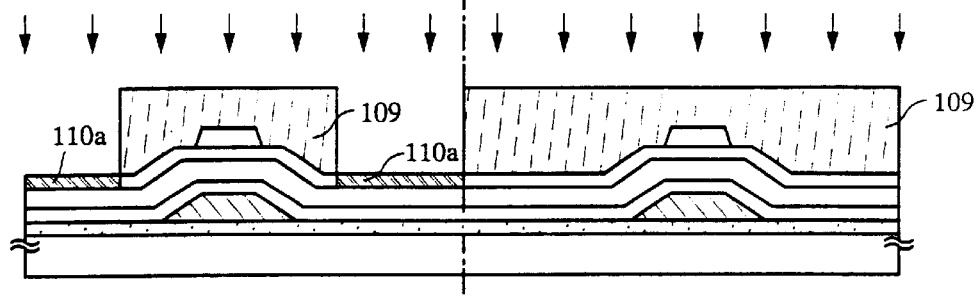

Subsequently, the photo-mask is used to form a resist mask 109 for covering part of an N-channel type TFT or a P-channel type TFT and a process for doping an n-type impurity element into the crystalline semiconductor film is performed to form a first impurity region (n+ region) 110a (FIG. 2B). Here, the size (length) of the resist mask 109 covering part of the N-channel type TFT in the direction of the source region to the drain region was made larger than the size (length) of the gate wiring (gate electrode) so that the first impurity region 110a did not overlap the gate wiring when viewed from the top. As the n-type impurity element for the semiconductor material, elements belonging to group XV, for example, P, As, Sb, N, Bi or the like can be used. In this process, P (phosphorus) is added into the crystalline semiconductor film, whose surface is exposed, by means of the plasma doping method by setting the doping conditions (such as dose and acceleration voltage) as appropriate. In addition, since the first impurity region 110a is a high concentration impurity region and is to be either the source region or the drain region, the dose is set so that the sheet resistance is 500Ω or less (preferably, 300Ω or less) at the completion of fabricating the TFTs.

Figure 2C:
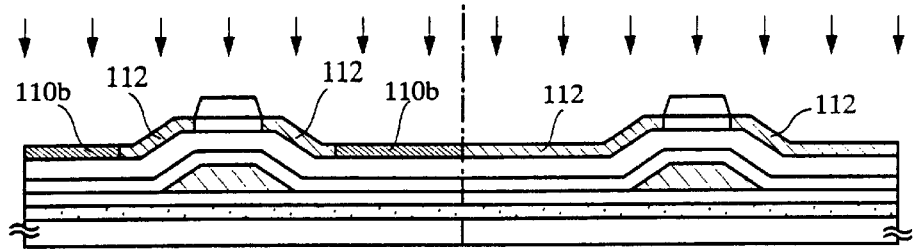

Subsequently, after the resist mask 109 has been removed, a process for adding an n-type impurity element into the crystalline semiconductor film is performed with the channel protection film 108 employed as a mask to form a second impurity region (n⁻ region) 112 (FIG. 2C). Since the second impurity region is formed with a mask of the channel protection film 108 smaller than the gate wiring, part of the second impurity region overlaps the gate wiring when viewed from the top. In addition, since the second impurity region is formed in a region where the resist mask 109 larger than the gate wiring has been removed, part of the second impurity region is adapted so as not to overlap the gate wiring when viewed from the top. The second impurity region 112 formed as such functions as a low concentration impurity region (hereinafter referred to as an LDD region), and the concentration of phosphorus of the second impurity region 112 is preferably set to within the range of $1 \times 10^{18}$ through $1 \times 10^{19}$ atoms/cm³ by the SIMS analysis. In this process, an impurity is further doped to form the first impurity region 110b, so that the portion immediately under the channel protection film becomes an intrinsic or a substantially intrinsic crystalline semiconductor region.

Furthermore, in this specification, to be intrinsic means a region where no impurities that can vary the Fermi level of silicon is contained, whereas a substantially intrinsic region means a region containing an n-type impurity or a p-type impurity within the concentration range (from $1 \times 10^{16}$ through $1 \times 10^{17}$ atoms/cm³ by the SIMS analysis) that allows threshold control, or a region where an opposite conductive impurity is intentionally doped to cancel out the conductivity.

Figure 2D:
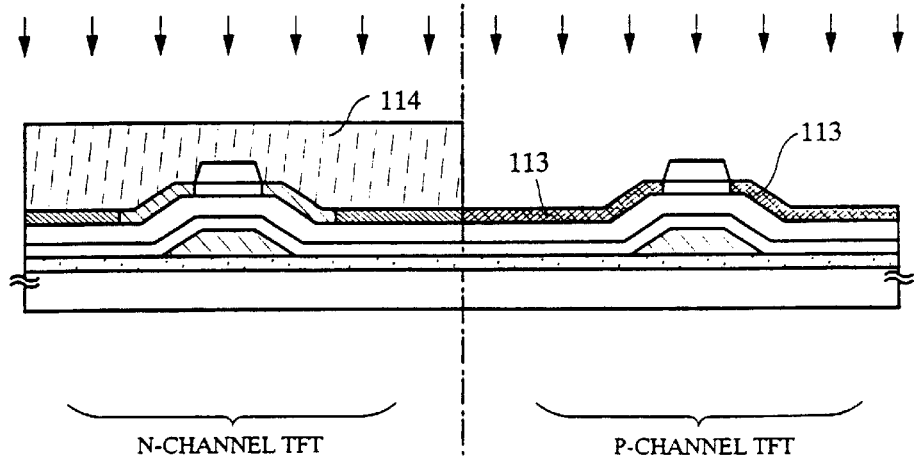

Subsequently, a photo-mask is used to form a resist mask 114 for covering the N-channel type TFT and a process for doping a p-type impurity element into the crystalline semiconductor film is performed to form a third impurity region (p+ region) 113 (FIG. 2D). As the p-type impurity element for an semiconductor material, impurity elements belonging to group XIII, for example, B, Al, Ga, In, Tl or the like can be used.

Figure 3A:
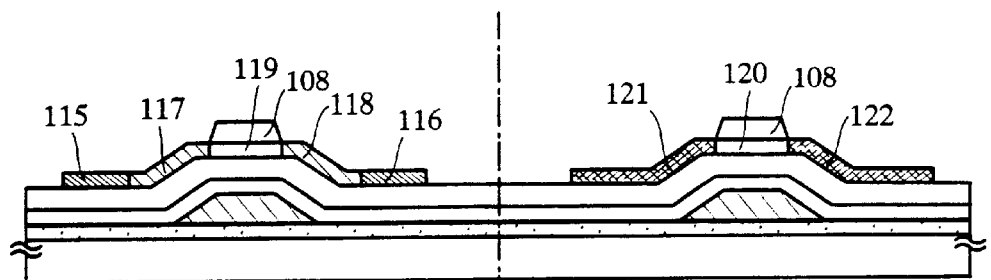
FIGS. 3A–3C are views showing TFT fabrication processes of Example 1.

Subsequently, after the resist mask 114 has been removed, impurity ions are activated or damaged at the time doping ions are to be recovered by means of furnace annealing, laser annealing, or lamp annealing. Thereafter, a known patterning technique is used to form an active layer having a desired shape. (FIG. 3A)

Through the foregoing processes, the source region 115, the drain region 116, the low concentration impurity regions 117 and 118, and the channel formation region 119 of the N-channel type TFT have been formed. The source region 121, the drain region 122, and the channel formation region 120 of the P-channel type TFT have also been formed.

Subsequently, the channel protection film 108 is removed to form an interlayer insulating film 123 on the entire surface. As the interlayer insulating film 123, any one of a silicon oxide film, a silicon nitride film, a silicon nitride oxide film, an organic resin film (such as a polyimide film or a BCB film), or a multilayer film of these films can be used.

Figure 3B:
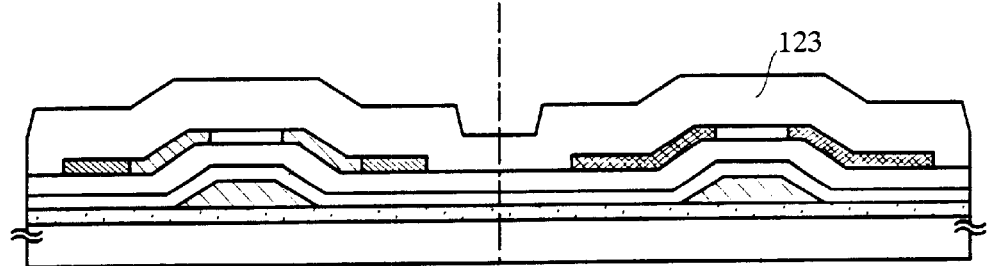
Figure 3C:
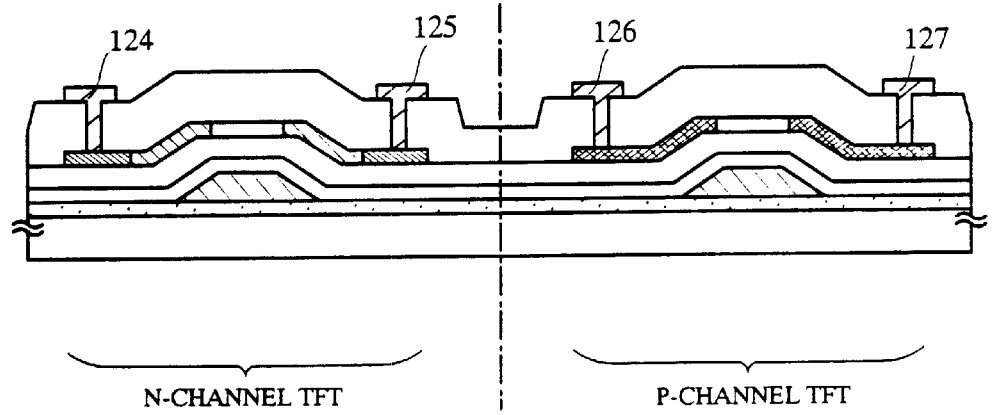

Then, using a known technique, contact holes are formed, and source wirings 124 and 126 and drain wirings 125 and 127 are formed to obtain the status shown in FIG. 3C. Finally, heat treatment is performed in a hydrogen atmosphere to hydrogenate the whole to complete the N-channel type TFT and P-channel type TFT. Furthermore, plasma hydrogenation may be employed for hydrogenation.

The circuit with the N-channel type TFT and the P-channel type TFT complementarily coupled together, shown in this embodiment, is called the CMOS circuit which is a basic circuit for constituting a semiconductor circuit. Such basic circuits can be combined to constitute basic logic circuitry such as a NAND circuit or a NOR circuit, or more complicated logic circuitry.

According to the configuration of this embodiment mode, the contamination caused by impurities from the glass substrate to the active layer can be prevented by means of the tantalum oxide film. This allows for making the concentration of sodium in the gate insulating film equal to $1 \times 10^{16}$ atoms/cm$^3$ or less, which is the lower limit or less of detection of the SIMS analysis in consideration of noise. Accordingly, the concentration of sodium in the active layer can be made equal to $1 \times 10^{16}$ atoms/cm$^3$ or less, thereby enabling improved reliability of the TFTs. Moreover, use of the tantalum oxide film as the blocking film allows for reducing variations in TFT property and thus providing improved reliability of the TFTs.

Furthermore, in the aforementioned embodiment, the channel protection film may be formed and then the LDD region may be formed by adding an impurity (throughdoping) via the insulating film after the insulating film 108 has been formed and the resist mask 109 has been removed (FIG. 2A). Adding of impurities via the insulating film facilitates control of the impurity concentration of the LDD region. In addition, the formation of this insulating film can prevent contamination caused by impurities in the atmosphere or the manufacturing equipment. In particular, the surface contamination caused by boron contained in the atmosphere can be effectively prevented. As the aforementioned insulating film, a silicon oxide film, a silicon nitride film, a silicon nitride oxide film (SiOxNy), an organic resin film (BCB film), or a multilayer film of these films can be used within a thickness range from 1 nm through 200 nm, preferably 10 nm through 150 nm.

In addition, in the aforementioned embodiment, a process for adding an impurity to the amorphous semiconductor film to control the threshold of TFTs may be added before the crystallization process. As the process for controlling the threshold, such a process can be employed in which a control insulating film (ranging from 100 through 200 nm in thickness) is provided on the amorphous semiconductor film and then boron is doped within the concentration range ($1 \times 10^{16}$ through $1 \times 10^{17}$ atoms/cm$^3$ by means of SIMS analysis) which allows threshold control and, thereafter, the control insulating film is removed.

In addition, in this embodiment, such an example has been shown in which the patterning of the active layer is carried out after the activation process, however, the present invention is not limited thereto. For example, the patterning may be carried out before the crystallization process or before doping.

Furthermore, in this embodiment, an example of the inverted stagger type has been shown, however, the blocking film of the present invention can be applied to an alternative TFT configuration.

EXAMPLES

Examples of the present invention are explained below, however, it is a matter of course that the present invention is not limited to these examples.

Example 1

This example of the present invention is explained in detail below with reference to FIGS. 1A through 3C.

First, a glass substrate (Corning 1737 with a glass distortion temperature of 667° C.) was prepared as a substrate 101. Then, a tantalum oxide film 150 was provided on the substrate 101 in order to prevent the diffusion of impurities from the substrate to improve the TFT electrical properties. In this example, the film was formed using a target composed of tantalum by means of the sputtering method carried out in a mixture atmosphere containing an oxygen gas within a thickness range from 100 nm through 300 nm. (FIG. 1A)

Such an example in which the tantalum oxide film is provided on one surface of the substrate has been shown in FIG. 1, however, the tantalum oxide film is effectively provided not only on one surface but also on both surfaces of the substrate. By providing the tantalum oxide film on both surfaces of the substrate, impurities such as sodium diffusing from the substrate at the time of fabricating the semiconductor device can be completely blocked. Moreover, the tantalum oxide film has excellent resistance to most acid solutions such as fluoric acid and has a small coefficient of thermal expansion and excellent heat resistance, and thus it is possible to improve the acid and heat resistance of the substrate by providing the tantalum oxide film on the reverse surface of the substrate. Still moreover, the tantalum oxide film can effectively cover the entire surface of the substrate.

Subsequently, a gate wiring (including the gate electrode) 102 in the form of a multilayer configuration (not shown for simplicity) was formed on the tantalum oxide film 150 (FIG. 1B). In this example, the sputtering method was used to form a multilayer of the tantalum oxide film (50 nm in thickness) and the tantalum film (250 nm in thickness) and then a known patterning technique, the photolithography method, was used to form the gate wiring (including the gate electrode) 102 having a multilayer configuration.

Subsequently, the gate insulating film 103 and the amorphous semiconductor film 104 were formed successively in the form of a multilayer configuration without being exposed to the atmosphere (FIG. 1C). In this example, in order to prevent impurities from diffusing from the gate wiring to the semiconductor film and the gate insulating film during fabrication, the silicon nitride film 103a (50 nm in thickness) and the silicon oxide film 103b (125 nm in thickness) were formed in the form of a multilayer configuration by means of the plasma CVD method to allow the layer to serve as a gate insulating film of a multilayer configuration. In this example, a two layer insulating film is employed as the gate insulating film, however, the gate insulating film may be of a single layer or of a multilayer configuration with three layers or more. In addition, in this example, an amorphous silicon film 54 nm in thickness was formed on the gate insulating film as the amorphous semiconductor film 104 by means of the plasma CVD method. Furthermore, the formation in the form of a multilayer configuration was carried out successively without exposure to the atmosphere so that each interface of the layers does not have contaminants adhered thereto from the atmosphere. Thereafter, heating treatment was carried out (at a temperature of 500° C. for one hour) in order to reduce the concentration of hydrogen, which prevents the crystallization of the semiconductor film, in the amorphous silicon film.

After the state shown in FIG. 1C has been obtained, the amorphous semiconductor film 104 was irradiated with infrared light or ultraviolet light (laser annealing) to be crystallized (laser crystallization) in order to form the crystalline semiconductor film 105 (semiconductor film including crystals) (FIG. 1D). In the case of using ultraviolet light as the crystallization technique, excimer laser light or intensified light emitted from an ultraviolet light lamp can be used, while in the case of using infrared light, infrared laser light or an intensified light emitted from an infrared light lamp can be used. In this example, irradiation was carried out with KrF excimer laser beams shaped in the form of a straight line. Furthermore, the conditions for the irradiation were a pulse frequency of 30 Hz, an overlap ratio of 96%, and a density of laser energy ranging from 100 through 500 mJ/cm$^2$, which is 360 mJ/cm$^2$ in this example. Furthermore, one can determine the conditions for laser crystallization (such as the wavelength of the laser light, the overlap ratio, the intensity of irradiation, the pulse width, the frequency of repetition, and the time of irradiation) as appropriate in consideration of the thickness of the amorphous semiconductor film 104, the temperature of the substrate and so forth. Furthermore, some conditions for laser crystallization may cause the semiconductor film to crystallize after passing through a melting state, or the semiconductor film to crystallize in a solid phase without being melted or in an intermittent state between the solid phase and liquid phase. This process allows the amorphous semiconductor film 104 to crystallize and change into the crystalline semiconductor film 105. In this example, the crystalline semiconductor film is a poly-crystalline silicon film (poly-silicon film).

Subsequently, the insulating film (which is to be a channel protection film later) 106 was formed which protects the channel formation region on the crystalline semiconductor film 105 formed as such. In this example, a silicon oxide film (200 nm in thickness) was formed. Then, the photo-resist mask 107 was formed in contact with the insulating film 106 by patterning (deposition, exposure, and development of the resist film) using exposure from the reverse surface (FIG. 1E). The formation of the resist mask by exposure from the reverse surface requires no mask, thereby allowing the number of masks for fabrication to be reduced. As shown in the drawing, the photo-resist mask was slightly reduced in size compared with the width of the gate wiring due to the diffraction of light.

Subsequently, with the photo-resist mask 107 being used as a mask, the insulating film 106 was etched to form the channel protection film 108 and thereafter the photo-resist mask 107 was removed (FIG. 2A). The surface of the crystalline silicon film at a region except the region in contact with the channel protection film 108 was made exposed through this process. This channel protection film 108 serves to prevent a dopant from being doped into a region that is to be a channel formation region in the following doping process.

Subsequently, the resist mask 109 was formed to cover the part of N-channel type TFT and the P-channel type TFT by patterning by use of a photo-mask and then a process was carried out for doping an n-type impurity element into the crystalline semiconductor film the surface of which is exposed to form the first impurity region (N+ region) 110a (FIG. 2B). In this example, a phosphorus element was used as an impurity that provides n-type conductivity. As a doping gas, the phosphorus was diluted with hydrogen into phosphine (PH$_3$) containing 1 through 10% (5% in this example) phosphorus with a dose of 5×10$^{14}$ atoms/cm$^2$. Moreover, one can set the pattern of the aforementioned resist mask 109 as appropriate to determine the width of the n+ region so as to facilitate obtaining comparatively easily the n$^-$ region and the channel formation region with a desired width.

Subsequently, after the resist mask 109 has been removed, with the channel protection film 108 employed as a mask, a process for doping an n-type impurity element into the crystalline semiconductor film is performed to form the second impurity region (n$^-$ region) 112 (FIG. 2C). In this example, as the doping gas, phosphorus was diluted with hydrogen into phosphine (PH$_3$) containing 1 through 10% (5% in this example) phosphorus with a dose of 3×10$^{13}$ atoms/cm$^2$, and an impurity region of 1×10$^{16}$ through 1×10$^{19}$ atoms/cm$^3$, which is given by the SIMS analysis, was formed. In addition, the second impurity region 112 formed as such functions as the LDD region. Furthermore, at this time, an impurity was further doped to form the first impurity region 110b, so that the region immediately under the channel protection film became an intrinsic or a substantially intrinsic crystalline semiconductor region. However, though not shown, the impurity element is doped so as to go more or less inside the channel protection film in practice.

Subsequently, a photo-mask was used to form the resist mask 114 to cover the N-channel type TFT and a process for doping a p-type impurity element into the crystalline semiconductor film was performed to form the third impurity region (p+ region) 113 (FIG. 2D). In this example, as the p-type impurity element, B (boron) was used. The boron was diluted with hydrogen into diborane (B$_2$H$_8$) containing 1 through 10% boron with a dose of 4×10$^{16}$ atoms/cm$^2$.

Subsequently, the resist mask 114 is removed to perform the process for activating the impurity by laser annealing or thermal annealing and thereafter heat treatment was carried out in a hydrogen atmosphere (at a temperature of 350° C. for one hour) to hydrogenate the whole. Furthermore, in this example, the hydrogenation was carried out by heat treatment, however, the plasma hydrogen treatment may be employed. Thereafter, an active layer having a desired shape was formed by a known patterning technique. (FIG. 3A)

Through the foregoing processes, the source region 115, the drain region 116, the low concentration impurity regions 117 and 118, and the channel formation region 119 of the N-channel type TFT have been formed. The source region 121, the drain region 122, and the channel formation region 120 of the P-channel type TFT have also been formed.

Subsequently, the channel protection film was removed and then, to cover the N-channel type TFT and the P-channel type TFT, formed by the plasma CVD method was an interlayer insulating film 123 of a multilayer configuration of a silicon oxide film 100 nm in thickness and of a silicon oxide film 940 nm in thickness that employs TEOS and oxygen ($O_2$) as the raw material gas. (FIG. 3B)

Then, contact holes were formed, and then the source wirings 124 and 126 and drain wirings 125 and 126 were formed to obtain the state shown in FIG. 3C. Finally, heat treatment was carried out in a hydrogen atmosphere to hydrogenate the whole in order to complete the N-channel type TFT and the P-channel type TFT. This hydrogenation may be carried out by the plasma hydrogen treatment.

Furthermore, in this example, the order of the processes may be altered to carry out the crystallization process after patterning the amorphous semiconductor film.

Furthermore, the impurity may be doped into the amorphous semiconductor film before the crystallization process to control the threshold of TFT.

As the configuration of the present invention, the contamination derived from the glass substrate to the active layer due to impurities can be prevented by means of the tantalum oxide film. Thus, the concentration of sodium in the gate insulating film, which is provided by the SIMS analysis, can be made equal to $1 \times 10^{16}$ atoms/cm$^3$ or less which is currently equal to or less than the lower limit of detection in consideration of noise. This allows for making the concentration of sodium in the active layer equal to $1 \times 10^{16}$ atoms/cm$^3$ or less, thereby providing improved reliability of TFTs. Moreover, use of the tantalum oxide film as the blocking film can contribute to reducing variations in TFT properties, thereby providing improved reliability of TFTs.

Example 2

In example 1, laser light was used to allow the amorphous silicon film to crystallize. In this example, such an example will be shown as allows the amorphous semiconductor film to crystallize in a way different from that of example 1. This example is explained below with reference to FIGS. 4 through 6D.

First, a glass substrate (Corning 1737 with a glass distortion temperature of 667° C.) was prepared as a substrate 201. Then, a tantalum oxide film 250 was provided on the substrate 201 in order to prevent the diffusion of impurities from the substrate to improve the TFT electrical properties. In this example, the film was formed using a target composed of tantalum by means of the sputtering method carried out in an atmosphere containing an oxygen gas mixture within a thickness range from 100 nm through 300 nm.

Figure 4A:
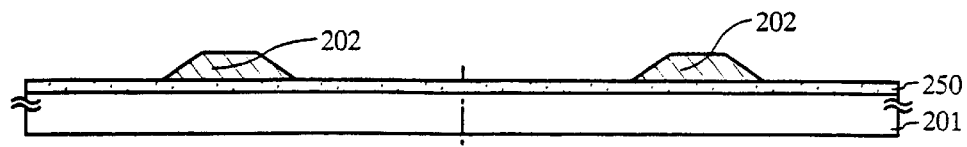
FIGS. 4A–4E are views showing TFT fabrication processes of Example 2.

Such an example in which the tantalum oxide film is provided on one surface of the substrate has been shown in FIG. 4A, however, the tantalum oxide film is effectively provided not only on one surface but also on both surfaces of the substrate. By providing the tantalum oxide film on both surfaces of the substrate, impurities such as sodium diffusing from the substrate at the time of fabricating the semiconductor device can be completely blocked. Moreover, the tantalum oxide film has excellent resistance to most acid solutions such as fluoric acid, and thus it is possible to prevent sodium contamination in etching processes by providing the tantalum oxide film on both surfaces of the substrate. Moreover, the tantalum oxide film has a small coefficient of thermal expansion and excellent heat resistance, and thus it is possible to improve the heat resistance of the substrate by providing the tantalum oxide film on the reverse surface of the substrate. Still moreover, the tantalum oxide film can effectively cover the entire surface of the substrate.

Subsequently, a gate wiring (including the gate electrode) 202 in the form of a multilayer configuration (not shown for simplicity) was formed on the tantalum oxide film 250 (FIG. 4A). In this example, the sputtering method was used to form a multilayer of the tantalum nitride film (50 nm in thickness) and the tantalum film (250 nm in thickness) and then a known patterning technique, the photolithography method, was used to form the gate wiring (including the gate electrode) 202 having a multilayer configuration.

Figure 4B:
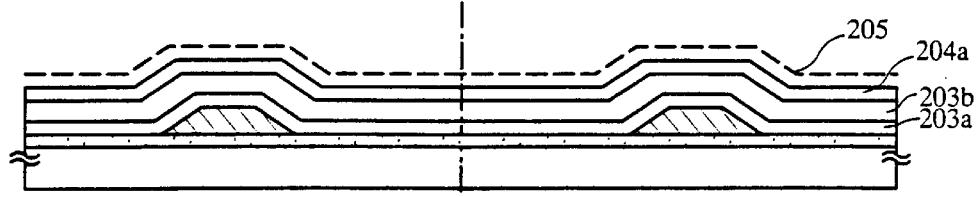

Subsequently, the gate insulating film 203 and the amorphous semiconductor film 204 were formed successively in the form of a multilayer configuration without being exposed to the atmosphere (FIG. 4B). In this example, the silicon nitride film 203a (50 nm in thickness) and the silicon oxide film 203b (125 nm in thickness) were formed in the form of a multilayer configuration by means of the sputtering method to allow the layer to serve as a gate insulating film of a multilayer configuration. Additionally, in this example, a two layer insulating film is employed as the gate insulating film, however, the gate insulating film may be of a single layer or of a multilayer configuration with three layers or more. In addition, in this example, an amorphous silicon film 54 nm in thickness was formed on the gate insulating film as the amorphous semiconductor film 204 by means of the plasma CVD method. Furthermore, the formation in the form of a multilayer configuration was carried out successively without exposure to the atmosphere so that each interface of the layers does not have contaminants adhered thereto from the atmosphere. Thereafter, heating treatment was carried out (at a temperature of 500° C. for one hour) in order to reduce the concentration of hydrogen, which prevents the crystallization of the semiconductor film, in the amorphous silicon film.

Subsequently, the amorphous silicon film 204a is irradiated with UV light in an oxygen atmosphere to form an extremely thin oxide film (not shown) on the surface thereof. This oxide film has a function to improve the wettability of a solution containing nickel to be coated later thereto.

Subsequently, the solution containing nickel is coated to the surface of the amorphous silicon film 204a. The content of nickel (by weight) can range from 0.1 through 50 ppm, or more preferably, from 1 ppm to 30 ppm. This is to make the concentration of nickel in the amorphous silicon film 204a equal to an order of $10^{16}$ through $10^{19}$ atoms/cm$^3$. A concentration of nickel $10^{16}$ atoms/cm$^3$ or less cannot provide the catalytic action of nickel. A concentration of nickel on the order of $10^{19}$ atoms/cm$^3$ allows for fabricating TFTs operable even without gettering, thus allowing for performing the gettering process with efficiency. Furthermore, the aforementioned concentration of nickel is defined by the measurements of SIMS.

In this example, a nickel acetate solution containing 10 ppm of nickel was coated. Then, the substrate 201 was spun by means of a spin coater to allow an excessive nickel acetate solution to be spun off the substrate and thus removed in order to form an extremely thin nickel containing layer 205 on the surface of the amorphous silicon film 204a. (FIG. 4B)

Figure 4C:
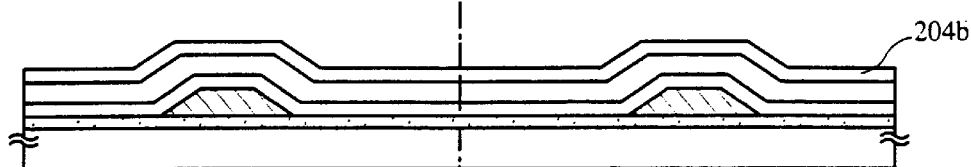

After the state shown in FIG. 4B is obtained, the amorphous silicon film 204a was crystallized by heating for four hours in a nitrogen atmosphere at a temperature of 550° C. A crystalline silicon film 204b was obtained through this crystallization process. Since crystal growth proceeds in the direction from the surface of the amorphous silicon film 204a, to which nickel has been doped, to the substrate 201 (in the vertical direction), this is to be called vertical growth (FIG. 4C). Furthermore, this example has been configured to form the nickel containing layer on the entire surface. However, such a configuration may be employed in which a resist or the like is used to form the nickel containing layer selectively to allow crystallization to proceed in the direction (horizontal direction) parallel to the surface of the substrate.

This example has employed Ni as an element for accelerating the crystallization, however, it can also use at least one element of Co, Fe, Pd, Pt, Cu, Au, Ge, Sn, and Pb. In addition, in this example, the element for accelerating the crystallization was added by means of the coating method. However, the sputtering method or the CVD method can be employed by which a coating, particles, clusters or the like, containing elements for accelerating the crystallization is brought into contact with the amorphous silicon film. Alternatively, the ion implantation method can be employed.

Furthermore, poly-crystal silicon films containing grain boundaries are formed through this crystallization process, however, silicon films in a micro crystal state can be formed under different conditions.

Moreover, the aforementioned heating treatment can be carried out in an electro-thermal furnace at temperatures ranging from 500 through 700° C., more preferably, at temperatures ranging from 550 through 650° C. At this time, the upper limit of the heating temperature needs to be made lower than the glass distortion temperature of the glass substrate 201 used in consideration of the heat resistance of the substrate. Temperatures exceeding the glass distortion temperature will cause warpage, contraction, or the like of the glass substrate to appear. In addition, the heating can be carried out for about 1 through 12 hours. This heating treatment is carried out by means of furnace annealing (heating treatment in an electro-thermal furnace). Furthermore, heating means such as laser annealing, the lamp annealing or the like can be used.

Figure 4D:
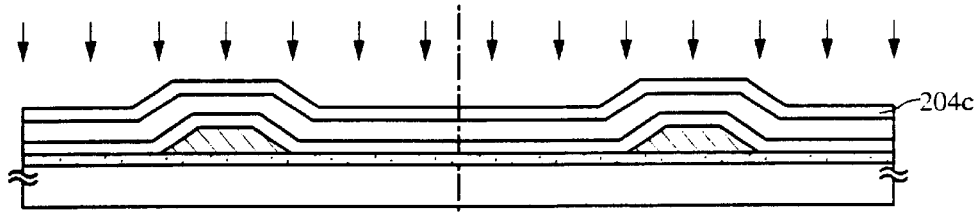

Subsequently, the resulting crystalline silicon film 204b is irradiated with laser light to obtain a crystalline silicon film 204c with the crystallinity thereof improved. In this example, a pulse oscillated KrF excimer laser (248 nm in wavelength) was used (FIG. 4D). Furthermore, the extremely thin oxide film that has been formed to improve the wettability of the solution may be removed before irradiation with laser light.

As the pulse oscillated laser, a short wavelength (in the ultraviolet light region) XeCl excimer laser, a long wavelength YAG laser or the like is employed. The excimer laser employed in this example oscillates ultraviolet light that causes the irradiated region to be instantaneously melted and solidified repeatedly. Accordingly, irradiation with the light of the excimer laser causes a kind of non-balanced state to be formed in which nickel is readily mobile.

In addition, amorphous components remain irregularly in the crystalline silicon film 204b obtained in the crystallization process shown in FIG. 4C. However, irradiation with laser light crystallizes such amorphous components completely, so that the crystallinity of the crystalline silicon film 204c is tremendously improved.

Furthermore, this laser irradiation process can be eliminated, however, laser irradiation provides such an effect in that the crystallinity is improved as well as the efficiency of the following gettering process. After irradiation with the laser, the concentration of nickel remaining in the crystalline silicon film 204c is on the order of $1 \times 10^{19}$ through $2 \times 10^{19}$ atoms/cm$^3$.

After the aforementioned crystallization process, a gettering technique (corresponding to Japanese Laid-Open Patent Publication No. 10-270363 and U.S. patent Ser. No. 09/050,182) may be employed to remove or reduce nickel remaining in the crystalline silicon film. Furthermore, in the publication, such a technique is described as performs heating treatment (at temperatures ranging from 300 through 700° C. for 1 through 12 hours) after the phosphorus element is doped to the entire surface or selectively. In addition, a method employing a vapor phase containing halogen elements may be used (corresponding to Japanese Laid-Open Patent Publication No. 9-312260 and U.S. patent application Ser. No. 08/785,489).

Figure 4E:
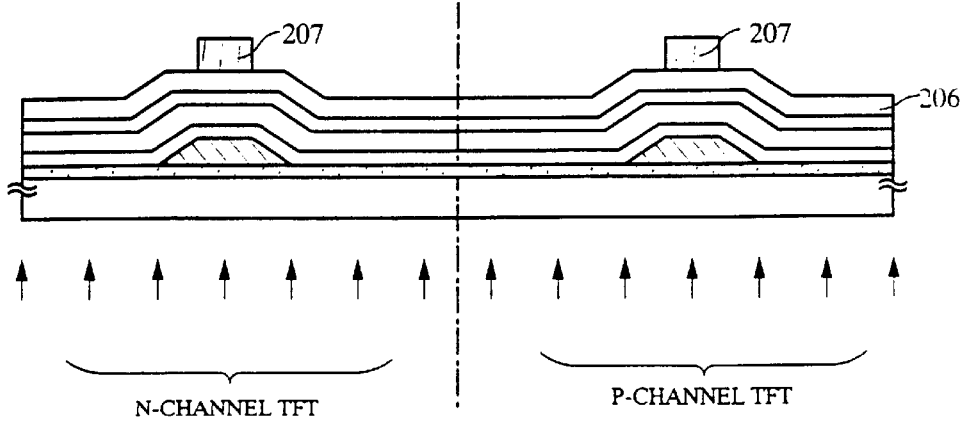

Subsequently, like the process of example 1 shown in FIG. 1E, an insulating film 206 (which is to be a channel protection film later) 200 nm in thickness for protecting the channel formation region was formed on the crystalline semiconductor 204c. Then, a resist mask 207 was formed in contact with the insulating film 206 by patterning by use of exposure from the reverse surface. (FIG. 4E)

Figure 5A:
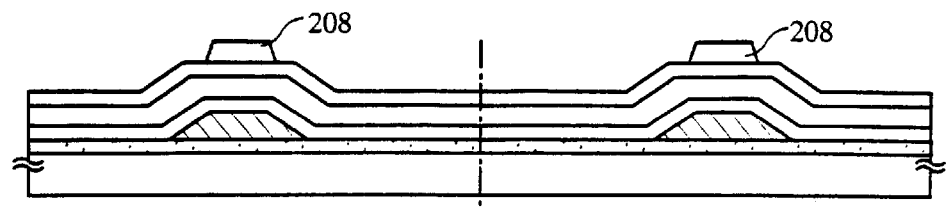
FIGS. 5A–5D are views showing TFT fabrication processes of Example 2.

Subsequently, the resist mask 207 was used to etch the insulating film 206 to form a channel protection film 208 and thereafter the resist mask 207 was removed. (FIG. 5A)

Figure 5B:
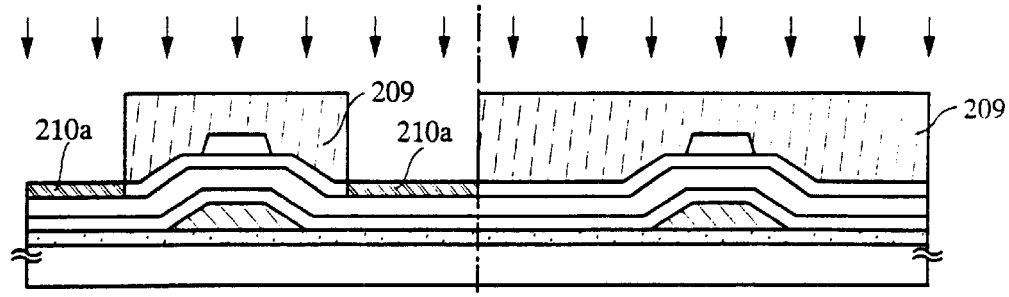

Subsequently, the resist mask 209 was formed to cover part of the N-channel type TFT and the P-channel type TFT by patterning by use of a photo-mask and then a process was carried out for doping an n-type impurity element (phosphorus) into the crystalline semiconductor film the surface of which is exposed to form the first impurity region (N+ region) 210a (FIG. 5B). In this example, as a doping gas, the phosphorus was diluted with hydrogen into phosphine (PH$_3$) containing 1 through 10% (5% in this example) phosphorus with a dose of $5 \times 10^{14}$ atoms/cm$^2$.

Figure 5C:
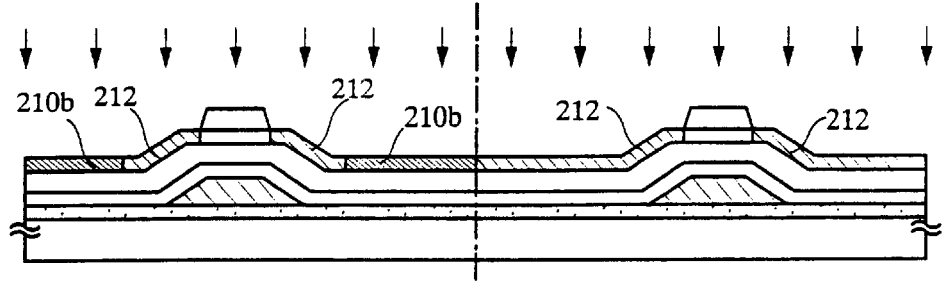

Subsequently, after the resist mask 209 has been removed, with the channel protection film 208 employed as a mask, a process for adding an n-type impurity element into the crystalline semiconductor film is performed to form the second impurity region (n$^-$ region) 212 (FIG. 5C). In this example, as the doping gas, phosphorus was diluted with hydrogen into phosphine containing 1 through 10% (5% in this example) phosphorus with a dose of $3 \times 10^{13}$ atoms/cm$^2$, and an impurity region of $1 \times 10^{18}$ through $1 \times 10^{19}$ atoms/cm$^3$, which is given by SIMS analysis, was formed. In addition, the second impurity region 212 formed as such functions as the LDD region. Furthermore, at this time, an impurity was further doped to form the first impurity region 210b, so that an intrinsic or a substantially intrinsic crystalline semiconductor region remained immediately under the channel protection film.

Figure 5D:
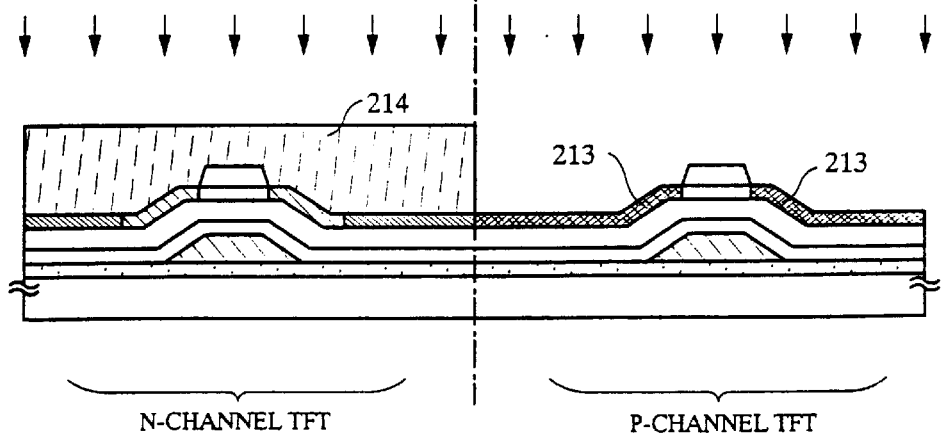

Subsequently, a photo-mask was used to form the resist mask 214 to cover the N-channel type TFT and a process for adding a p-type impurity element into the crystalline semiconductor film was performed to form the third impurity region (p+ region) 213 (FIG. 5D). In this example, as a doping gas, diborane (B$_2$H$_6$) diluted with hydrogen to contain 1 through 10% boron was used with a dose of $4 \times 10^{16}$ atoms/cm$^2$.

Figure 6A:
FIGS. 6A–6D are views showing TFT fabrication processes of Example 2.

Subsequently, the resist mask 214 is removed and then a heating treatment was carried out at temperatures ranging from 300 through 700° C. for 1 through 12 hours, a technique (Japanese Laid-Open Patent Publication No. 8-330602) for reducing the concentration of nickel was applied to this example. In this example, the heating treatment was carried out at a temperature of 600° C. for 8 hours to cause the nickel remaining inside the LDD region and the channel formation region to move toward the high concentration impurity region (the source region and the drain region) (FIG. 6A). This allows for obtaining a channel formation region in which the concentration of nickel has been reduced ($1 \times 10^{18}$ atoms/cm$^3$ or less, more preferably, $1 \times 10^{16}$ atoms/cm$^3$ or less, which is given by SIMS analysis). At the same time the catalytic element was reduced through this heating treatment, damage occurring to the crystallinity on doping was recovered and the process for activating the impurity was carried out by thermal annealing. The furnace annealing, the laser annealing, or the lamp annealing may be additionally carried out. Thereafter, heat treatment (at a temperature of 350° C. for one hour) was carried out in a hydrogen atmosphere to hydrogenate the whole. Furthermore, the plasma hydrogenation treatment may be employed for the hydrogenation.

Figure 6B:
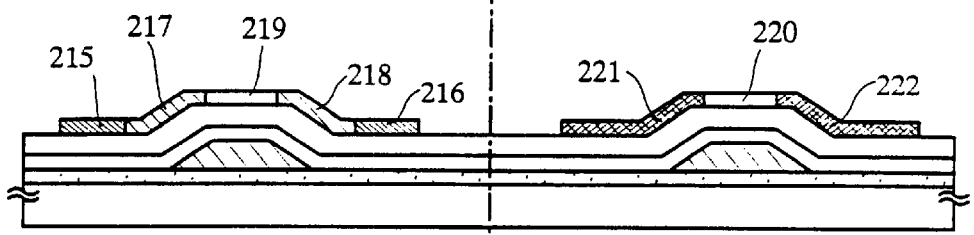

Thereafter, an active layer having a desired shape was formed by a known patterning technique. (FIG. 6B)

Through the foregoing processes, the source region 215, the drain region 216, the low concentration impurity regions 217 and 218, and the channel formation region 219 of the N-channel type TFT have been formed. The source region 221, the drain region 222, and the channel formation region 220 of the P-channel type TFT have also been formed.

Figure 6C:
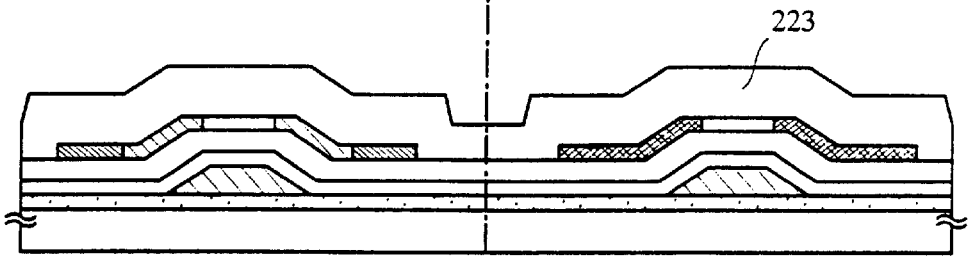

Subsequently, the channel protection film 208 was removed and then, to cover the N-channel type TFT and the P-channel type TFT, formed by the plasma CVD method was an interlayer insulating film 223 of a multilayer configuration of a silicon oxide film 100 nm in thickness and a silicon oxide film 940 nm in thickness that employs TEOS and oxygen ($O_2$) as the raw material gas. (FIG. 6C)

Figure 6D:
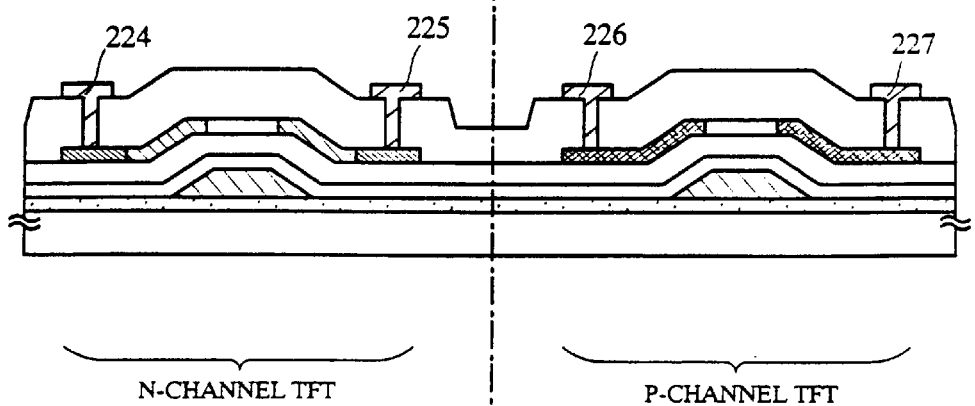

Then, contact holes were formed, and then the source wirings 224 and 226 and drain wirings 225 and 226 were formed to obtain the state shown in FIG. 6D. Finally, heat treatment was carried out in a hydrogen atmosphere to hydrogenate the whole in order to complete the N-channel type TFT and the P-channel type TFT. This hydrogenation may be carried out by plasma hydrogen treatment.

As the configuration of the present invention, the contamination derived from the glass substrate to the active layer due to impurities can be prevented by means of the tantalum oxide film. Thus, the concentration of sodium in the gate insulating film, which is provided by SIMS analysis, can be made equal to $1 \times 10^{16}$ atoms/cm$^3$ or less which is currently equal to or less than the lower limit of detection in consideration of noise. This allows for making the concentration of sodium in the active layer equal to $1 \times 10^{16}$ atoms/cm$^3$ or less, thereby providing improved reliability of TFTs. Moreover, use of the tantalum oxide film as the blocking film can contribute to reducing variations in TFT properties, thereby providing improved reliability of TFTs. Furthermore, this example can employ part of the configuration of example 1.

Example 3

An example of the configuration of a semiconductor device comprising the N-channel type TFT and the P-channel type TFT fabricated through the fabrication processes of the aforementioned example 1 or 2 is explained with reference to FIGS. 7A–8B).

Figure 7A:
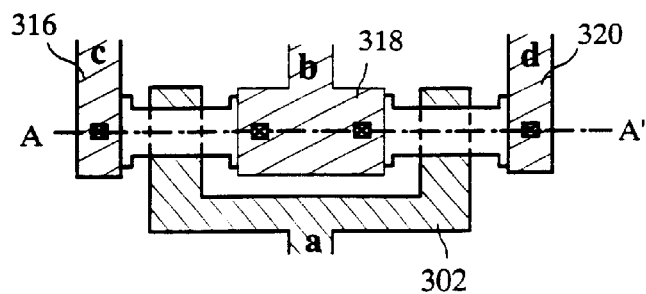
FIGS. 7A–7C show a top view, cross-sectional view, and circuit diagram of a CMOS circuit, respectively, of Example 3.
Figure 7B:
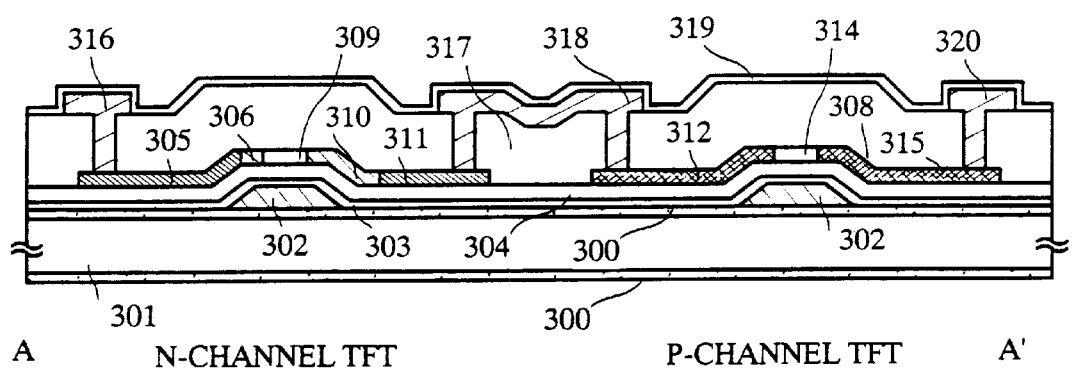
Figure 7C:
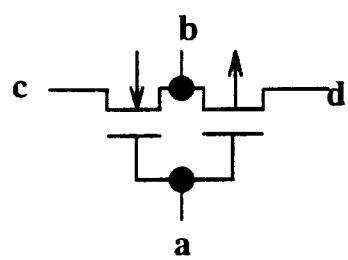
Figure 8A:
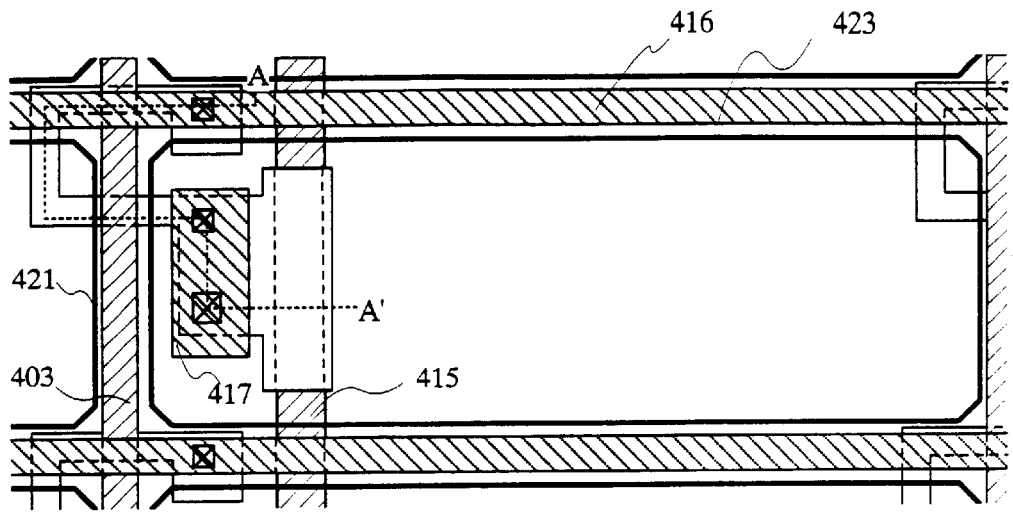
FIGS. 8A–8B show a top view and cross-sectional view of a pixel portion, respectively, of Example 3.
Figure 8B:
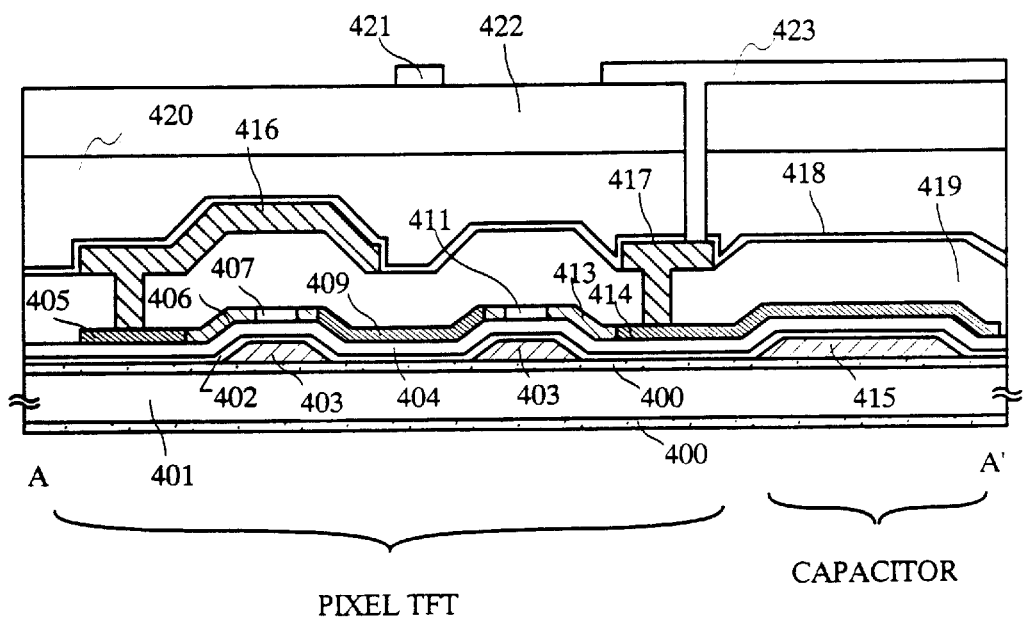

The semiconductor device, according to this example, comprises peripheral driver circuit and a pixel portion on the same substrate. For simplicity of illustration, in this example, a CMOS circuit that constitutes part of the peripheral driver circuit is shown in FIGS. 7A–7C, while a pixel TFT (an N-channel type TFT) that constitutes part of the pixel portion is shown in FIGS. 8A–8B. Furthermore, in addition to the fabrication processes of examples 1 and 2, a passivation film 319, which is 0.2 through 0.4 $\mu$m in thickness, was formed. It is desirable to use a film containing nitrogen as a passivation film, for example, a silicon nitride film.

Furthermore, in addition to examples 1 and 2, the tantalum oxide film of a blocking film was provided not only on one surface of the substrate (on the upper surface or the surface on which the TFT is formed) but also on both surfaces (the upper surface and the reverse surface). The blocking film may not be necessarily provided on both surfaces of the substrate, however, by providing the tantalum oxide film on both surfaces of the substrate, impurities such as sodium diffusing from the substrate at the time of fabricating the semiconductor device can be completely blocked. Moreover, the tantalum oxide film has excellent resistance to most acid solutions such as fluoric acid, and thus it is possible to prevent sodium contamination in etching processes by providing the tantalum oxide film on both surfaces of the substrate. Moreover, the tantalum oxide film has a small coefficient of thermal expansion and excellent heat resistance, and thus it is possible to improve the heat resistance of the substrate by providing the tantalum oxide film on the reverse surface of the substrate. Still moreover, the tantalum oxide film can effectively cover the entire surface of the substrate.

The CMOS circuit shown in FIG. 7C is also called the inverter circuit, being a basic circuit that constitutes a semiconductor circuit. Such inverter circuits can be combined to constitute basic logic circuitry such as a NAND circuit or a NOR circuit, or more complicated logic circuitry.

FIG. 7A corresponds to the top view of FIG. 7B. In FIG. 7A, the portion cut by line A–A' corresponds to a cross-sectional configuration of the CMOS circuit of FIG. 7B. In addition, FIG. 7C is a circuit diagram of the inverter circuit corresponding to FIG. 7A and FIG. 7B.

Referring to FIG. 7B, the blocking films (tantalum oxide films) 300 are formed in contact with both the plane (designated the upper surface) on which the TFT is formed and the plane (designated the reverse surface) on which the TFT is not formed of the glass substrate 301. The TFT is formed on the blocking film (tantalum oxide film) 300 formed on the upper surface.

Then, a gate wiring (including a gate electrode) 302 is formed in contact with the underlying tantalum oxide film. The gate wiring is formed using a conductive film made of a material predominantly composed of the tantalum element (Ta) and has good adhesion to the tantalum oxide film provided as an underlying film. In addition to tantalum (Ta), it is also possible to employ as the gate wiring a conductive film composed of materials which are predominantly composed of one or more elements selected from the group consisting of tungsten (W), molybdenum (Mo), titanium (Ti), chromium (Cr), and silicon (Si).

Then, a first insulating film 303 composed of silicon nitride and a second insulating film 304 composed of silicon oxide are provided in contact with the gate wiring. The tantalum film formed as a blocking film blocks the diffusion of sodium from the glass substrate, thereby making the concentration of sodium equal to $1 \times 10^{16}$ atoms/cm$^3$ or less in the first insulating film 303 and the second insulating film 304, which function as gate insulating films. This in turn allows for making the concentration of sodium in the active layer equal to $1 \times 10^{16}$ atoms/cm$^3$ or less, thereby allowing for providing improved reliability of TFTs. Moreover, use of the tantalum oxide film as the blocking film can contribute to reducing variations in TFT properties, thereby providing improved reliability of TFTs.

The P-channel type TFT of the CMOS circuit is provided, as active layers in contact with the second insulating film, with a p+ region 312 (drain region) and a p+ region 315 (source region), and a channel formation region 314. In the aforementioned examples 1 and 2, in order to reduce the number of processes, the P-channel type TFT is not provided with a low concentration impurity region (LDD region) between said high concentration impurity region and said channel formation region, but may be formed. Contact holes are provided in a first interlayer insulating film 317 that covers the active layers, then wirings 318 and 320 are connected to the p+ regions 312 and 315, and further the passivation film 319 is formed thereon. Though not shown for simplicity of illustration, a second interlayer insulating film is formed further thereon, then a lead wiring is connected to the wiring 320, and then a third interlayer insulating film is formed to cover the top thereof.

On the other hand, the N-channel type TFT is provided, as active layers, with an n+ region 305 (source region) and an n+ region 311 (drain region), a channel formation region 309, and n⁻ regions 306 and 310 between said n+ regions and the channel formation region. Furthermore, the n⁻ region 310 adjacent to the drain region is formed larger in width than the n⁻ region 306 adjacent to the source region, thereby providing improved reliability. Contact holes are formed in the first interlayer insulating film 317 that covers the top of the active layers, then the n+ regions 305 and 311 are provided with the wirings 316 and 318 formed thereon, and the passivation film 319 is formed on the top thereof. Though not shown for simplicity of illustration, a second interlayer insulating film is formed further thereon, then a lead wiring is connected to the wiring 320, and then a third interlayer insulating film is formed to cover the top thereof. Furthermore, the portions other than the active layers have generally the same configuration as that of the aforementioned P-channel type TFT, and so explanation is omitted for simplicity.

FIG. 8A corresponds to the top view of FIG. 8B. In FIG. 8A, the portion cut by line A–A' corresponds to a cross-sectional configuration of the pixel portion of FIG. 8B.

In principle, the N-channel type TFT formed on the pixel portion is provided with the same structure as that of the N-channel type TFT of the CMOS circuit. Tantalum oxide films 400 are formed in contact with both surfaces of a glass substrate 401, then a gate wiring 403 is formed adjacent in contact with one of the tantalum oxide films 400, and a first insulating film 402 composed of silicon nitride and a second insulating film 404 composed of silicon oxide are provided in contact with the gate wiring. The tantalum oxide films 400 provided as an underlying film block the sodium diffusing from the glass substrate 401, thereby enabling making the concentration of sodium in the first insulating film 402 and the second insulating film 404 that function as the gate insulating films equal to $1 \times 10^{16}$ atoms/cm$^3$ or less which is equal to or less than the lower limit of detection of SIMS analysis in consideration of noise. As the active layers in contact with the second insulating film, an n+ regions 405, 409, 414, the channel formation regions 407 and 411, and n⁻ regions 406 and 413 between said n+ region, and said channel formation regions. The concentration of sodium in the first insulating film 402 and the second insulating film 404 can be made low and thus the concentration of sodium in the active layers can be made equal to $1 \times 10^{16}$ atoms/cm$^3$ or less, thereby enabling providing improved reliability of TFTs. Contact holes are formed in the first interlayer insulating film 419 that covers the top of the active layers, then the n+ region 405 is connected with a wiring 416, the n+ region 414 is connected with a wiring 417, and a passivation film 418 is formed on the top thereof. Then, a second interlayer insulating film 420 is formed further thereon. Then, a third interlayer insulating film 422 is formed further thereon, and a pixel electrode 423 composed of a transparent electrode such as ITO or SnO$_2$ is connected thereto. Moreover, 421 is a pixel electrode adjacent to the pixel electrode 423.

Furthermore, the capacitor portion of the pixel portion is formed by means of a capacitance wiring 415 and the n+ region 414 with the first insulating film 402 and the second insulating film 404 employed as the dielectric body.

In this example, a transmissive LCD was fabricated as an example, however, the present invention is not limited particularly thereto. For example, it is possible to fabricate a reflective LCD by using a metallic material having reflectivity as a material of the pixel electrode, by changing the pattern of the pixel electrode, and by adding/eliminating several processes as is appropriate.

Furthermore, in this example, the gate wiring of the pixel TFT of the pixel portion is formed in a double gate configuration. However, the wiring may be formed in a multi-gate configuration such as a triple gate configuration in order to reduce variations in the off current. Moreover, a single gate configuration may be employed in order to improve the aperture ratio.

The TFT according to this example shows less variation in an electrical property. This example may be configured by means of combining the examples 1 and 2.

Example 4

Figure 9:
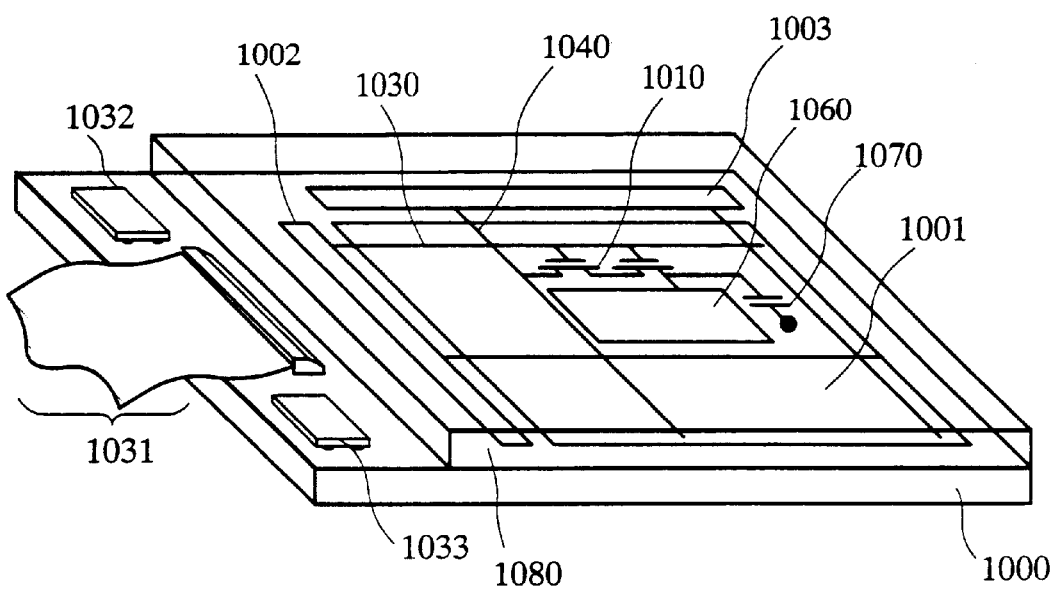
FIG. 9 is a view showing an example of an active matrix substrate of Example 4.

This example shows a liquid-crystal display device fabricated according to the present invention in FIG. 9. Known means can be used for fabricating the pixel TFTs (pixel switching elements) and assembling the cell, thus a detailed explanation is omitted.

FIG. 9 is a schematic view showing an active matrix liquid-crystal panel according to this example. As shown in FIG. 9, an active matrix substrate faces an opposite substrate and a liquid crystal is sandwiched in between these substrates. The active matrix substrate comprises a pixel portion 1001 formed on the glass substrate 1000, a scan line drive circuit 1002 and a signal line drive circuit 1003.

The scan line drive circuit 1002 and the signal line drive circuit 1003 are connected to the pixel portion 1001 by a scan line 1030 and a signal line 1040, respectively. These drive circuits 1002 and 1003 mainly comprise CMOS circuits.

The scan line 1030 is formed for each of the rows of the pixel portion 1001 and the signal line 1040 is formed for each of the columns thereof. Near an intersection of the scan line 1030 and the signal line 1040, a pixel TFT 1010 is formed. The gate electrode of the pixel TFT 1010 is connected to the scan line 1030, while the source is connected to the signal line 1040. Moreover, the drain is connected with a pixel electrode 1060 and a storage capacitor 1070.

The opposite substrate 1080 is provided with a transparent conductive film such as ITO formed on the entire surface of the glass substrate. The transparent conductive film is an opposite electrode opposing the pixel electrode 1060 of the pixel portion 1001. The liquid crystal is operated by an electric field to be established between the pixel electrode and the opposite electrode. On the opposite substrate 1080, an alignment film, a black matrix, or a color filter is formed as required.

On the glass substrate of the active matrix substrate, IC chips 1032 and 1033 are fabricated by making use of the area for allowing a FPC 1031 to be attached. These IC chips 1032 and 1033 comprise circuits, formed on a silicon substrate, such as a video signal processing circuit, a timing pulse generation circuit, a γ correction circuit, a memory circuit, or an operational circuit.

Furthermore, either a transmissive or a reflective liquid-crystal display device can be fabricated according to the present invention. One can freely select either. As described above, the present invention can be applied to any type of active matrix electro-optical devices (semiconductor devices).

Furthermore, any one of the configurations of examples 1 through 3 can be employed or each of the examples can be freely combined with another in order to fabricate the semiconductor device shown in this example.

Example 5

The present invention can be applied to an active matrix EL (electroluminescence) display device. An example of the device is shown in FIG. 10.

Figure 10:
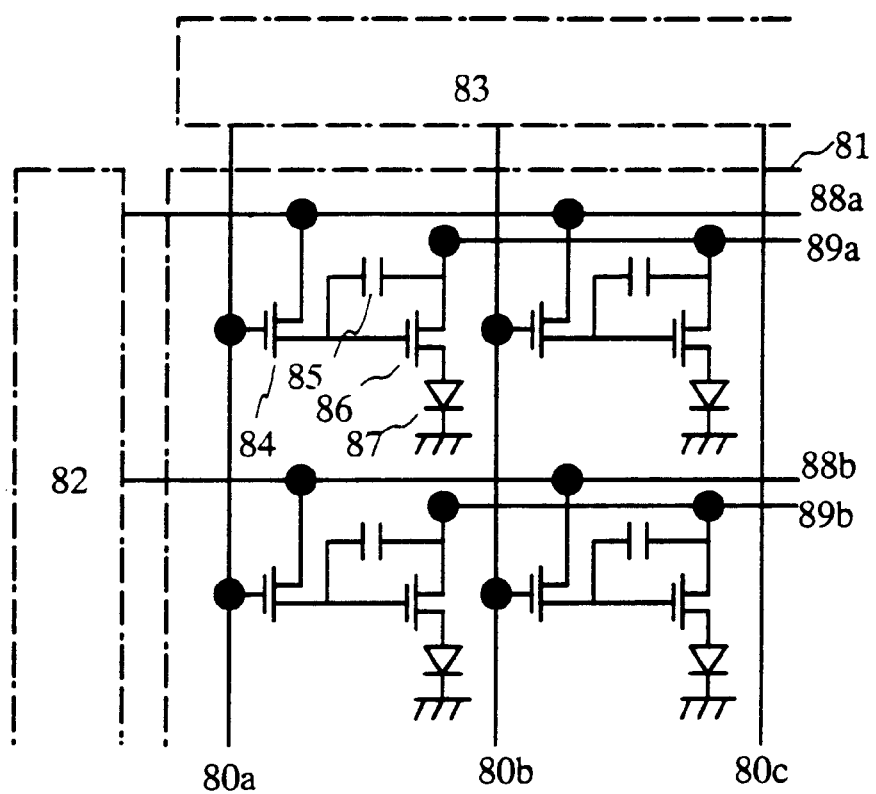
FIG. 10 is a view showing a circuit diagram of an EL panel of Example 5.

FIG. 10 shows a circuit diagram of an active matrix EL display device. Reference number 81 denotes a display region and, on the periphery thereof, provided are an X-direction peripheral drive circuit 82 and Y-direction peripheral drive circuit 83. Each of the pixels of the display region 81 comprises a switching TFT 84, a capacitor 85, a current control TFT 86, and an organic EL element 87, with the switching TFT 84 being connected with an X-direction signal line 88a (or 88b) and Y-direction signal line 80a (or 80b or 80c). In addition, the current control TFT 86 is connected with power lines 89a and 89b.

Furthermore, any one of the configurations according to examples 1 through 3 may be combined for the active matrix EL display device of this example.

Example 6

The present invention can be applied generally to conventional IC techniques. That is, the present invention is applicable to all of the semiconductor circuits currently available in the market. For example, the present invention can be applied to microprocessors such as the RISC processor that have circuits integrated on one chip or the ASIC processor and to high frequency circuits such as a signal processing circuit typically used in the liquid crystal driver circuits (such as a D/A converter, a γ correction circuit, or a signal divider circuit) or portable apparatuses (such as a portable telephone, a PHS, or a mobile computer).

Furthermore, semiconductor circuits such as microprocessors are mounted to various electronic apparatuses to function as a central circuit. Typical electronic apparatuses include a personal computer, a portable information terminal apparatus, and other various types of electrical appliances. Moreover, they also include a control computer for use in vehicles (such as automobiles or trains). The present invention is also applicable to those various semiconductor devices.

Example 7

The CMOS circuits or pixel portions formed, according to the present invention, are applicable to various electro-optical devices (such as an active matrix liquid-crystal display device, an active matrix EL display device, or an active matrix EC display device). That is, the present invention can be applied to any electronic apparatuses into which these electro-optical devices are incorporated as a display medium.

Such electronic apparatuses include a video camera, a digital camera, a projector (rear or front type), a head-mounted display device (a goggle-type display device), a car navigation system, a personal computer, a portable information terminal (such as a mobile computer, a portable telephone, or an electronic book), and so forth. Examples of these apparatuses are shown in FIGS. 11A through 13C.

Figure 11A:
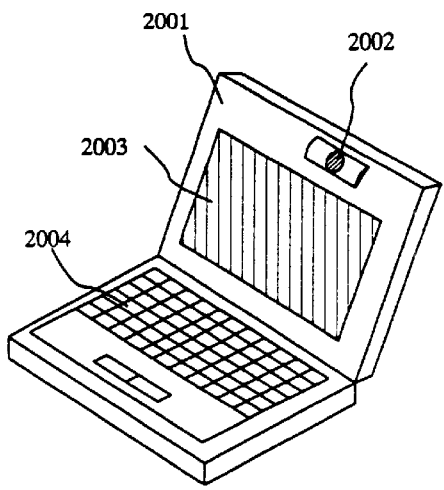
FIGS. 11A–11F are views showing examples of an electronic apparatus of Example 7.

FIG. 11A shows a personal computer that comprises a main body 2001, an image input portion 2002, a display device 2003, and a keyboard 2004. The present invention can be applied to the image input portion 2002, the display device 2003, and other signal control circuits.

Figure 11B:
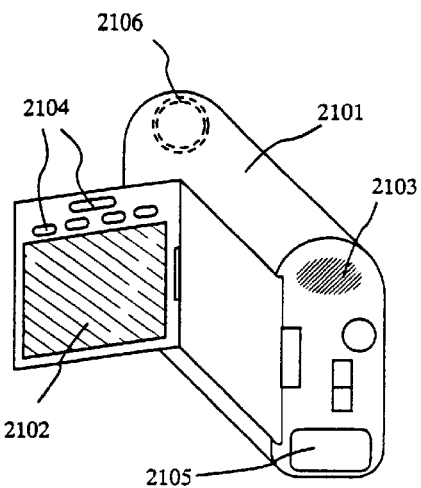

FIG. 11B shows a video camera, which comprises a main body 2101, a display device 2102, a voice input portion 2103, a control switch 2104, a battery 2105, and an image receiving portion 2106. The present invention can be applied to the display device 2102, the voice input portion 2103, and other signal control circuits.

Figure 11C:
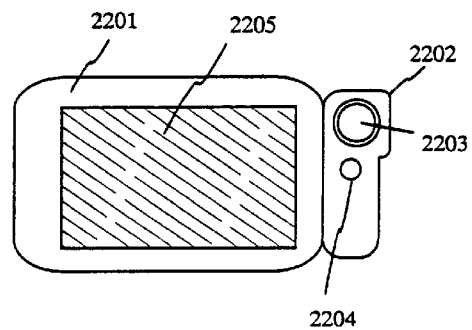

FIG. 11C shows a mobile computer, which comprises a main body 2201, a camera portion 2202, an image receiving portion 2203, a control switch 2204, and a display device 2205. The present invention can be applied to the display device 2205 and other signal control circuits.

Figure 11D:
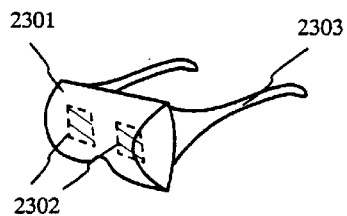

FIG. 11D shows a goggle type display device, which comprises a main body 2301, a display device 2302, and an arm portion 2303. The present invention can be applied to the display device 2302 and other signal control circuits.

Figure 11E:
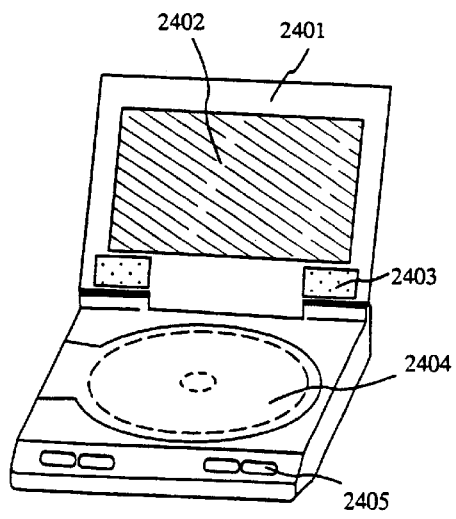

FIG. 11E shows a player employing a recording medium on which programs are recorded (hereinafter referred to as the recording medium), which comprises a main body 2401, a display device 2402, a speaker portion 2403, the recording medium 2404, and a control switch 2405. Furthermore, this device employs a recording medium such as a DVD (Digital Versatile Disc) or CD to be used for music appreciation, movie appreciation, games, or the Internet. The present invention can be applied to the display device 2402 and other signal control circuits.

Figure 11F:
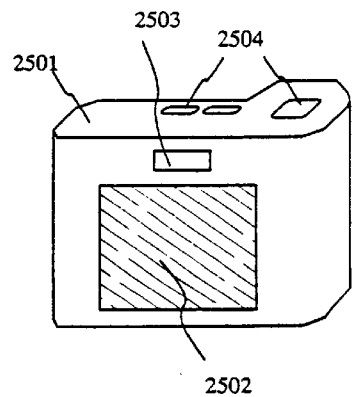

FIG. 11F shows a digital camera, which comprises a main body 2501, a display device 2502, an eyepiece portion 2503, a control switch 2504, and an image receiving portion (not shown). The present invention can be applied to the display device 2502 and other signal control circuits.

Figure 12A:
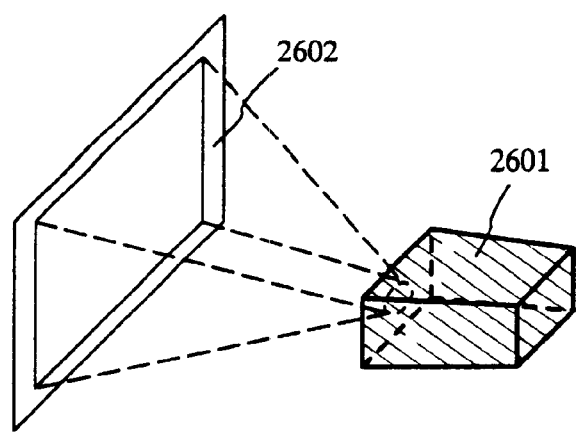
FIGS. 12A–12B are views showing examples of an electronic apparatus of Example 7.

FIG. 12A shows a front-type projector, which comprises a light source optical system and a display device 2601, and a screen 2602. The present invention can be applied to the display device and other signal control circuits.

Figure 12B:
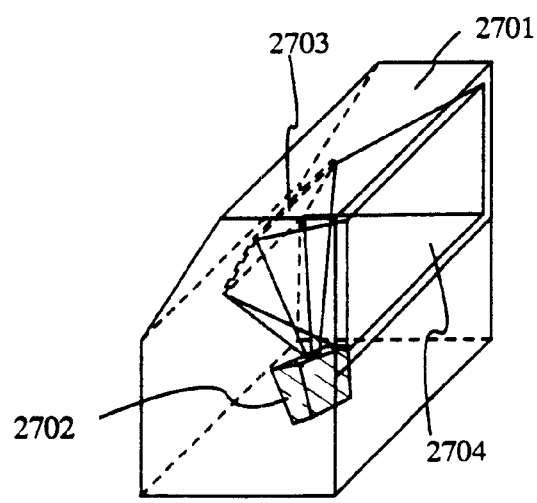

FIG. 12B shows a rear-type projector, which comprises a main body 2701, a light source optical system and a display device 2702, a mirror 2703, and a screen 2704. The present invention can be applied to the display device and other signal control circuits.

Figure 13A:
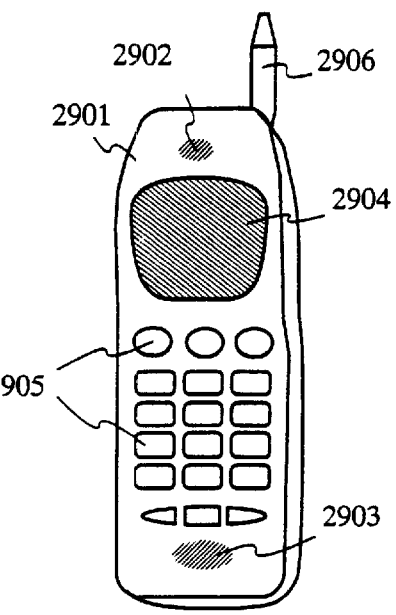
FIGS. 13A–13C are views showing examples of an electronic apparatus of Example 7.

FIG. 13A shows a portable telephone, which includes a main body 2901, a voice output portion 2902, a voice input portion 2903, a display portion 2904, a control switch 2905, an antenna 2906 and so forth. The present invention can be applied to the voice output portion 2902, the voice input portion 2903, the display portion 2904, and other signal control circuits.

Figure 13B:
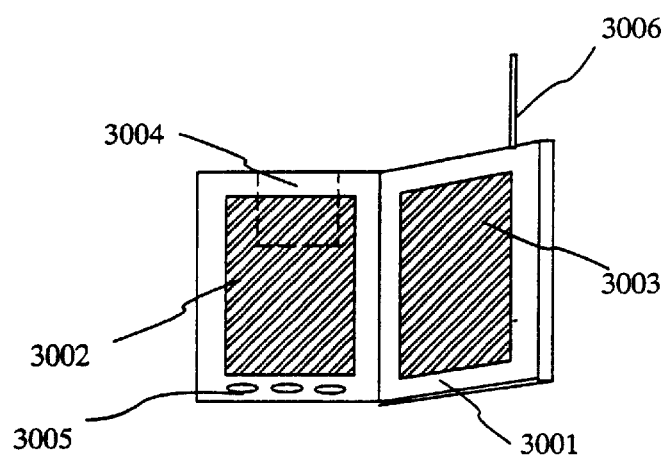
Figure 13C:
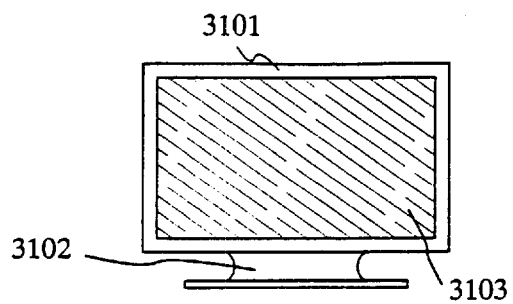

FIG. 13B shows a portable book (an electronic book), which includes a main body 3001, display portions 3002 and 3003, a recording medium 3004, a control switch 3005, an antenna 3006 and so forth. The present invention can be applied to the display portions 3002 and 3003, and other signal control circuits.

FIG. 13B shows a display, which includes a main body 3101, a support base 3102, a display portion 3103, and the like. The present invention can be applied to the display portion 3103. The present invention has an advantage particularly with a large display screen such as a display measuring 10 inches or more (especially, 30 inches or more) from the upper left corner to the lower right corner.

As described above, the present invention has wide applicability and thus is applicable to electronic apparatuses in a variety of fields. Moreover, the electronic apparatuses, according to this example, can be realized by any combination of configurations of examples 1 through 6.

Example 8

In either example 1 or 2, such an example has been shown in which a tantalum oxide film is formed by means of sputtering a target composed of tantalum in a mixture atmosphere containing oxygen. In this example, an example in which the tantalum oxide film is formed by means of a method different from that of example 1 or 2 has been shown.

First, a target composed of tantalum was sputtered in a xenon atmosphere onto a glass substrate (Corning 1737 with a glass distortion temperature of 667° C.) to form a tantalum film 50 within a thickness range from 50 nm through 250 nm, more preferably, from 50 through 150 nm. As the sputtering atmosphere, an argon atmosphere or other rare gas atmosphere may be employed. Alternatively, a xenon atmosphere, an argon atmosphere, or other rare gas atmosphere mixture may be employed.

Subsequently, a voltage was applied to the tantalum film in an anodizing apparatus to anodize the tantalum film and thus a tantalum oxide film was formed. As the conditions, an ethylene glycol solution that contains 3% tartaric acid was used as the electrolyte at an electrolyte temperature of 10° C., an obtained voltage of 40 through 80V, the time of voltage application of 30 minutes, and a current supplied of 10 mA/one substrate.

After the anodizing process has been completed, observation of the glass substrate by naked eye showed that the tantalum film was almost transparent. This is because the tantalum film was anodized to form a tantalum oxide film.

Furthermore, the sheet resistance of the tantalum film was 100.1 Ω/square under the initial condition (before the anodization), however, the sheet resistance after anodization showed a reading over the measurement range of the measuring apparatus. Since the maximum measurable value of the measuring apparatus is 5000 kΩ/square, the sheet resistance after anodization is not less than 5000 kΩ/square. Furthermore, the sheet resistance value is an average value of 5 measurements. It can be seen from the extremely large value of the sheet resistance that the tantalum film was oxidized to form a tantalum oxide film.

The reflectance of the tantalum oxide film formed by the anodizing method was 20.4% for the tantalum oxide film 40 nm in thickness formed on the glass substrate (Corning 1737). The refractive index determined based on this reflectance was 2.65.

After the tantalum oxide film has been formed, TFTs were fabricated according to example 1 or 2. Furthermore, example 1 and 2 may be combined freely. In addition, in examples 3 through 7, the configuration with the tantalum oxide film formed by the fabrication method according to this example may be employed.

According to the present invention, the TFT properties can be improved by providing a blocking film that can ensure the prevention of the diffusion of impurities such as sodium from the glass substrate to the active layer. In addition, cracks in the coating can be prevented a decrease in yield. Accordingly, an active matrix liquid-crystal display device can be provided at low cost with a large display area and of a high performance. Moreover, in a bottom gate TFT, a blocking layer can be formed which has excellent adhesion to the gate wiring.

According to the configuration of the present invention, the contamination caused by impurities from the glass substrate to the active layer can be prevented by the tantalum oxide film, thereby enabling variations in TFT properties to be reduced and thus providing improved reliability of the TFT.

What is claimed is:

1. A method for fabricating a semiconductor device, said method comprising:

forming a tantalum oxide film in contact with a glass substrate, forming a gate wiring over the tantalum oxide film, forming a gate insulating film adjacent to the gate wiring over the glass substrate, forming a semiconductor film adjacent to the gate wiring with the gate insulating film interposed therebetween, crystallizing the semiconductor film into a crystalline semiconductor film, patterning the crystalline semiconductor film to form a crystalline semiconductor layer, adding selectively an impurity element selected from the group consisting of group XIII and XV into the crystalline semiconductor layer to form at least a high concentration impurity region, and adding selectively an impurity element selected from the group consisting of group XIII and XV into the crystalline semiconductor layer to form a low concentration impurity region.

2. A method according to claim 1, wherein the gate insulating film includes sodium at a concentration of $1 \times 10^{16}$ atoms/cm$^3$ or less.

3. A method according to claim 1, wherein the tantalum oxide film is formed on both surfaces of the glass substrate.

4. A method according to claim 1, further comprising:

forming a first interlayer insulating film over the crystalline semiconductor film;

forming at least an electrode over the first interlayer insulating film and electrically connected to the high concentration impurity region;

forming a second interlayer insulating film over the electrode and the first interlayer insulating film;

forming a pixel electrode over the second interlayer insulating film and electrically connected to the electrode.

5. A method according to claim 1, wherein the semiconductor device is a liquid crystal display device.

6. A method according to claim 1,
wherein the semiconductor device is an active matrix EL display device.

7. A device according to claim 1,
wherein the semiconductor device is one selected from the group consisting of a personal computer, a video camera, a mobile computer, a goggle type display device (a head-mounted display device), a player employing a recording medium, a digital camera, a front-type projector, a rear-type projector, a portable telephone, a portable book (an electronic book), and a display.

* * * * *